(12) United States Patent
Honda et al.

(10) Patent No.: US 10,429,447 B2
(45) Date of Patent: Oct. 1, 2019

(54) VOLTAGE SENSING DEVICE

(71) Applicant: DENSO CORPORATION, Kariya, Aichi-pref. (JP)

(72) Inventors: Kazutaka Honda, Kariya (JP); Tomoya Yamada, Kariya (JP)

(73) Assignee: DENSO CORPORATION, Kariya (JP)

(*) Notice: Subject to any disclaimer, the term of this patent is extended or adjusted under 35 U.S.C. 154(b) by 35 days.

(21) Appl. No.: 15/956,799

(22) Filed: Apr. 19, 2018

(65) Prior Publication Data

US 2019/0041463 A1  Feb. 7, 2019

(30) Foreign Application Priority Data

Aug. 4, 2017  (JP) ................. 2017-151633

(51) Int. Cl.
| | |
|---|---|
| *G01R 31/3835* | (2019.01) |
| *H02J 7/00* | (2006.01) |
| *G01R 1/30* | (2006.01) |
| *G01R 15/00* | (2006.01) |
| *G01R 31/3842* | (2019.01) |

(52) U.S. Cl.
CPC .......... *G01R 31/3835* (2019.01); *G01R 1/30* (2013.01); *G01R 15/002* (2013.01); *G01R 31/3842* (2019.01); *H02J 7/0021* (2013.01); *H02J 2007/005* (2013.01)

(58) Field of Classification Search
CPC .... H02J 7/0021; H02J 2007/005; G01R 1/30; G01R 15/002; G01R 31/3842; G01R 31/3835
See application file for complete search history.

(56) References Cited

U.S. PATENT DOCUMENTS

2007/0188146 A1* 8/2007 Nakano ............... H02J 7/0047
                                                320/132
2018/0145543 A1* 5/2018 Piasecki ............... H02J 50/12

FOREIGN PATENT DOCUMENTS

| JP | 3752888 B2 | 3/2006 |
| JP | 2007-240524 A | 9/2007 |
| JP | 2010-122162 A | 6/2010 |
| JP | 5593036 B2 | 9/2014 |

* cited by examiner

*Primary Examiner* — David V Henze-Gongola
(74) *Attorney, Agent, or Firm* — Posz Law Group, PLC

(57) ABSTRACT

A voltage sensing device includes: a multiplexer configured to choose either two corresponding voltages at two voltage sensing target nodes or two corresponding voltages at the terminals of a shunt resistor, and output either the two corresponding voltages at the two voltage sensing target nodes or the two corresponding voltages at the terminals of the shunt resistor, which are chosen by the multiplexer, as a first output voltage and a second output voltage; a differential switched capacitor amplifier circuit including a sampling capacitor and a feedback capacitor and configured to sample the first output voltage and the second output voltage through the sampling capacitor, and output sensing voltages corresponding to the first output voltage and the second output voltage by transferring a charge stored in the sampling capacitor through the feedback capacitor; and an operation control unit configured to control the multiplexer and the differential switched capacitor amplifier circuit.

10 Claims, 26 Drawing Sheets

VOLTAGE SENSING DEVICE

CROSS REFERENCE TO RELATED APPLICATIONS

This application is based on Japanese Patent Application No. 2017-151633 filed on Aug. 4, 2017, the disclosure of which is incorporated herein by reference.

TECHNICAL FIELD

The present disclosure relates to a voltage sensing device that senses voltages.

BACKGROUND

Battery monitoring apparatuses that monitor batteries such as lead batteries and lithium ion batteries have been each configured to measure voltages and currents of the battery and to perform various signal processing and the like using the measurement result. In this case, the current is detected on the basis of a terminal voltage of a shunt resistor interposed in series in a path through which the current flows.

In order to suppress a consumption current in a steady state to a low level, the shunt resistor having a comparatively small resistance value is often used. Therefore, the terminal voltage of the shunt resistor is smaller than the voltage of the battery. Accordingly, a dedicated amplifier for amplifying the terminal voltage of the shunt resistor is required for the sensing circuit for sensing the current. In such circumstances, a sensing circuit for sensing the voltage of the battery and a sensing circuit for sensing the current of the battery must be separately provided conventionally, which results in, for example, an increase in circuit scale and an increase in manufacturing cost.

In the configuration described in Patent Literature 1, the same sensing circuit can be used in common for voltage sensing and current sensing by making the capacitance ratio of the capacitor used for the ΔΣ modulator different between the current sensing and the voltage sensing. According to the above configuration, the circuit scale can be reduced.

[Patent Literature 1] JP 5593036 B2

SUMMARY

However, with the above configuration, the sensing speeds of the current and the voltage are different from each other, and the current and the voltage cannot be sampled at the same timing. Thus, in the above configuration, the current sampling cycle and the voltage sampling cycle become different from each other, and it is difficult to enhance the accuracy of various signal processing performed using the detected values of the current and the voltage (for example, state of charge (SOC) estimation and the like). That is, with the above configuration, although the circuit scale is reduced, highly accurate sensing cannot be achieved.

It is an object of the present disclosure to provide a voltage sensing device that achieves in high-precision sensing according to the dynamic range of an input while suppressing an increase in the circuit scale.

A voltage sensing device according to the present disclosure is configured to switch between a voltage sensing mode for sensing a voltage across two voltage sensing target nodes and a current sensing mode for sensing a voltage across terminals of a shunt resistor for sensing a current. The voltage sensing device includes: (i) a multiplexer that is configured to choose either two corresponding voltages at the two voltage sensing target nodes or two corresponding voltages at the terminals of the shunt resistor, and output either the two corresponding voltages at the two voltage sensing target nodes or the two corresponding voltages at the terminals of the shunt resistor, which are chosen by the multiplexer, as a first output voltage and a second output voltage; (ii) a differential switched capacitor amplifier circuit that includes a sampling capacitor and a feedback capacitor, and that is configured to execute a sampling operation of sampling the first output voltage and the second output voltage through the sampling capacitor, and output sensing voltages corresponding to the first output voltage and the second output voltage by transferring a charge, which is stored in the sampling capacitor, through the feedback capacitor; and (iii) an operation control unit that is configured to control the multiplexer and the differential switched capacitor amplifier circuit. Additionally, the differential switched capacitor amplifier circuit is configured to change a gain of the differential switched capacitor amplifier circuit. Moreover, the operation control unit is configured to switch an operation mode to the voltage sensing mode by controlling the multiplexer to output each of the two corresponding voltages at the two voltage sensing target nodes, and controlling the differential switched capacitor amplifier circuit to change the gain to a first gain. Furthermore, the operation control unit switches the operation mode to the current sensing mode by controlling the multiplexer to output each of the two corresponding voltages at the terminals of the shunt resistor, and controlling the differential switched capacitor amplifier circuit to change the gain to a second gain, which is larger than the first gain.

In this case, the switched capacitor amplifier circuit is configured to have switchable gains (switchable amplification factors). The operation control unit controls the operation of the multiplexer so as to output each voltage of the two voltage sensing target nodes and controls the operation of the switched capacitor amplifier circuit so as to switch the gain (amplification factor) to the first gain (first amplification factor), thereby switching the operation mode to the voltage sensing mode. Further, the operation control unit controls the operation of the multiplexer so as to output the terminal voltages of the shunt resistors, and controls the operation of the switched capacitor amplifier circuit so as to switch the gain to the second gain (second amplification factor) higher than the first gain, thereby switching the mode to the current sensing mode.

In the above configuration, each of the signal processing paths in the voltage sensing mode and the current sensing mode is a path of "multiplexer→switched capacitor amplifier circuit" and the paths are the same route to each other. In the above configuration, the voltage sensing mode and the current sensing mode using the same signal processing path are switched in a time sharing manner. In addition, the amplification factor of the switched capacitor amplifier circuit in the current sensing mode can be switched to the second amplification factor higher than the first amplification factor which is the amplification factor in the voltage sensing mode. Therefore, according to the above configuration, without requiring a dedicated amplifier for amplifying the terminal voltage of the shunt resistor and a resistor provided in association therewith, which are conventionally necessary, both the voltage between sensing target nodes and the voltage across terminals of the shunt resistor, which are greatly different in value from each other can be accurately detected.

According to such a configuration, since the amplifier and the resistor are unnecessary, errors due to these components are reduced, and at the same time the power consumption and the circuit area can be reduced. Further, in the above configuration, a circuit is shared for sensing a voltage and a current, so that the circuit scale can be thereby kept smaller.

Further, according to the above configuration, the signal processing paths in the voltage sensing mode and the current sensing mode are each a path in which voltages to be detected are directly sampled, and are the same path. Thus, with the above configuration, sensing the voltage and the current at the same sampling cycle becomes possible, and the accuracy of various types of signal processing such as SOC estimation performed using the detected values of a current and a voltage can be improved. As described above, according to the above configuration, an excellent effect can be obtained so that high-precision sensing can be achieved according to the dynamic range of the input while suppressing an increase in the circuit scale.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
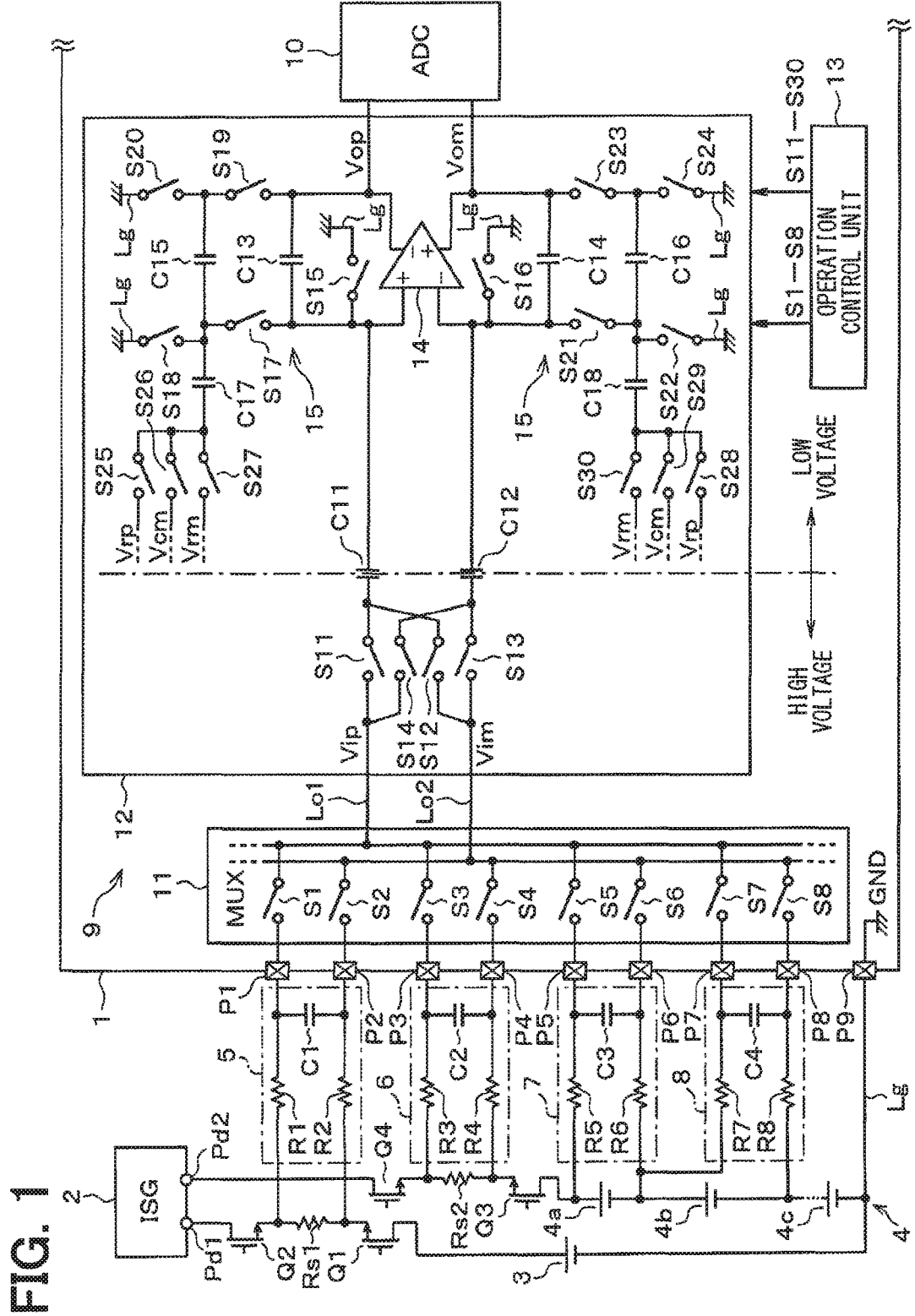
FIG. 1 is a diagram schematically showing a configuration of a battery monitoring apparatus according to a first embodiment.

Hereinafter, several embodiments of the present disclosure will be described with reference to the drawings. In each embodiment, substantially the same components are denoted by the same reference numerals, and description thereof is omitted.

First Embodiment

Hereinafter, a first embodiment will be described with reference to FIGS. 1 to 9.

A battery monitoring apparatus 1 shown in FIG. 1 monitors a battery 3, an assembled battery 4 and the like for supplying power to an integrated starter generator 2 (hereinafter referred to as an ISG 2) mounted on a vehicle, and is configured as an ASIC, for example. The battery 3 is a lead battery, and its positive terminal is connected to a power supply terminal Pd1 of the ISG 2 via a transistor Q1, shunt resistor Rs1, and transistor Q2. Note that the transistors Q1 and Q2 are all N-channel type MOS transistors. The negative terminal of the battery 3 is connected to a ground line Lg.

In the assembled battery 4, a plurality of battery cells, which are secondary batteries such as lithium ion batteries, are connected in series in multiple stages. Accordingly, a common mode voltage is superimposed on the plurality of battery cells. The common mode voltage for battery cells connected on the upper stage side of the assembled battery 4, that is, on the higher potential side thereof is higher. In FIG. 1 and others, only three battery cells 4a to 4c which are a part of a plurality of battery cells and only configurations corresponding thereto are shown.

The positive terminal of the battery cell 4a provided at the uppermost stage of the assembled battery 4, namely the highest potential side of the assembled battery 4 is connected to the power supply terminal Pd2 of the ISG 2 via a transistor Q3, shunt resistor Rs2, and transistor Q4. Note that the transistors Q3 and Q4 are all N-channel type MOS transistors. The negative terminal of the battery cell 4c provided at the lowest stage of the assembled battery 4, namely the lowest potential side of the assembled battery 4 is connected to the ground line Lg.

The power supply path extending from the positive terminal of the battery 3 to the power supply terminal Pd1 can be opened and closed by the transistors Q1 and Q2 and the execution and suspension of power supply from the battery 3 to the ISG 2 can be switched by turning on and off these transistors. The power supply path extending from the positive terminal of the battery cell 4a to the power terminal Pd2 can be opened and closed by the transistors Q3 and Q4 and execution and suspension of power supply from the assembled battery 4 to the ISG 2 can be switched by turning on and off these transistors.

The battery monitoring apparatus 1 has a function of sensing a current flowing in the battery 3, a function of sensing the current flowing in the assembled battery 4, namely the battery cells 4a to 4c, and a function of sensing each voltage of the battery cells 4a and 4b. The current flowing through the battery 3 is detected on the basis of the voltage across terminals of the shunt resistor Rs1 provided so as to be interposed in series in the path through which the current flows. The current flowing through the assembled battery 4 is detected on the basis of the voltage across terminals of the shunt resistor Rs2 provided so as to be interposed in series in the path through which the current flows.

The battery monitoring apparatus 1 includes terminals P1 and P2 corresponding to respective terminals of the shunt resistor Rs1 and terminals P3 and P4 corresponding to respective terminals of the shunt resistor Rs2. The terminals of the shunt resistor Rs1 and the terminals P1 and P2 are connected via a filter 5 for removing noise. The filter 5 is an RC filter including a resistor R1 connected between the high potential side terminal of the shunt resistor Rs1 and the terminal P1, a resistor R2 connected between the low potential side terminal of the shunt resistor Rs1 and the terminal P2 and a capacitor C1 connected between the terminals P1 and P2.

The terminals of the shunt resistor Rs2 and the terminals P3 and P4 are connected via a filter 6. The filter 6 is an RC filter configured similarly to the filter 5, and includes resistors R3 and R4 and a capacitor C2.

The battery monitoring apparatus 1 includes: (i) terminals P5 and P6 corresponding to the respective terminals of the battery cell 4a; (ii) terminals P7 and P8 corresponding to the respective terminals of the battery cell 4b; and (iii) a terminal P9 for supplying a ground potential (0 V). Note that the terminals P5 and P6 and the terminals P7 and P8 each correspond to two voltage sensing target nodes.

The terminals of the battery cell 4a and the terminals P5 and P6 are connected via a filter 7. The filter 7 is an RC filter configured similarly to the filter 5 and the like, and includes resistors R5 and R6 and a capacitor C3. The terminals of the battery cell 4b and the terminals P7 and P8 are connected via a filter 8. The filter 8 is an RC filter configured similarly to the filter 5 and the like, and includes resistors R7 and R8 and a capacitor C4. The negative terminal of the battery cell 4c, namely the ground line Lg is connected to the terminal P9.

The battery monitoring apparatus 1 includes a voltage sensing device 9, an A/D converter 10 (hereinafter referred to as an ADC 10), and the like. The voltage sensing device 9 is switchable between the voltage sensing mode and the current sensing mode. The voltage sensing mode is a mode used for sensing the voltage between the terminals P5 and P6, namely the voltage of the battery cell 4a or the voltage between the terminals P7 and P8, namely the voltage of the battery cell 4b.

Further, the current sensing mode is a mode used at the time of sensing the voltage between the terminals P1 and P2, that is, sensing the voltage across terminals of the shunt resistor Rs1 for sensing the current flowing in the battery 3 or at the time of sensing the voltage between the terminals P3 and P4, that is, sensing the voltage across terminals of the shunt resistor Rs2 for sensing the current flowing in the assembled battery 4.

The voltage sensing device 9 includes a multiplexer 11 (hereinafter referred to as MUX 11), a switched capacitor amplifier circuit (or a differential switched capacitor amplifier circuit) 12 (hereinafter referred to as SC amplifier circuit 12), and an operation control unit 13. The MUX 11 includes a plurality of switches S1 to S8, and terminals on one side of the switches S1 to S8 are connected to the terminals P1 to P8 respectively. Terminals on the other side of the switches S1, S3, S5 and S7 are connected to a first output line Lo1, and terminals on the other side of the switches S2, S4, S6 and S8 are connected to a second output line Lo2.

By turning on and off of the switches S1 to S8, the MUX 11 selects one of the corresponding voltages at the terminals P1 and P2, the corresponding voltages at the terminals P3 and P4, the corresponding voltages at the terminals P5 and P6, and the corresponding voltages at the terminals P7 and P8, and then outputs the selected two corresponding voltages to the subsequent stage via the first output line Lo1 and the second output line Lo2. In this case, the voltage output via the first output line Lo1 corresponds to the first output voltage, and the voltage output via the second output line Lo2 corresponds to the second output voltage.

The SC amplifier circuit 12 includes an OP amplifier 14 having a differential output, capacitors C11 to C18, and switches S11 to S30. A voltage output from the MUX 11 through the first output line Lo1 (hereinafter referred to as an input voltage Vip) and a voltage output through the second output line Lo2 (hereinafter referred to as an input voltage Vim) are input to the SC amplifier circuit 12.

The SC amplifier circuit 12 is a differentially configured sample hold circuit that outputs sensing voltages corresponding to the input voltages Vip and Vim by sampling the input voltages Vip and Vim by the capacitors C11 and C12 corresponding to the sampling capacitors and by transferring the sampled charges through the capacitors C13 to C16 corresponding to the feedback capacitors. The SC amplifier circuit 12 also performs level shifting to reduce the high common mode voltage to a low common mode reference voltage Vcm. As the details will be described later, the SC amplifier circuit 12 is capable of switching its amplification factor (gain).

The common voltage of the OP amplifier 14 is set to be equal to the reference voltage Vcm serving as a reference for voltage sensing. The reference voltage Vcm is an intermediate voltage (for example, +2.5 V) of the power supply voltage (for example, +5 V) of each circuit of the voltage sensing device 9. The OP amplifier 14 outputs output voltages Vop and Vom from its inverting output terminal and the non-inverting output terminal, respectively.

The output voltages Vop and Vom are equal to sensing voltages corresponding to the input voltages Vip and Vim, and are converted into digital data by the differential input type ADC 10. This digital data represents sensing values of the input voltages Vip and Vim, and is acquired by an upper controller (not shown). As will be described in detail later, the SC amplifier circuit 12 has a configuration capable of providing an offset so that the output voltages Vop and Vom fall within the input voltage range (for example, +2.5 V to −2.5 V) of the ADC 10.

The capacitors C11 and C12 forming a pair in the differential configuration correspond to the first sampling capacitor and the second sampling capacitor, respectively. The capacitors C11 and C12 have the same capacitance value Cs. Note that the "same capacitance value" in this specification includes not only values completely coinciding with each other but also those having a slight difference from each other and not coinciding strictly, if the intended effect can be ensured.

One terminal of the capacitor C11 is connected to the first output line Lo1 via the switch S11 and is also connected to the second output line Lo2 via the switch S12. One terminal of the capacitor C12 is connected to the second output line Lo2 via the switch S13 and is also connected to the first output line Lo1 via the switch S14.

The other terminal of the capacitor C11 is connected to the non-inverting input terminal of the OP amplifier 14 and also connected to the ground line Lg via the switch S15. The other terminal of the capacitor C12 is connected to the inverting input terminal of the OP amplifier 14 and also connected to the ground line Lg via the switch S16.

The capacitors C13 and C14 forming a pair in the differential configuration have the same capacitance value Cf. Further, the capacitors C15 and C16 forming a pair in the differential configuration have the same capacitance value Cf2. The capacitor C13 is connected between the non-inverting input terminal and the inverting output terminal of the OP amplifier 14. The capacitor C14 is connected between the inverting input terminal and the non-inverting output terminal of the OP amplifier 14.

One terminal of the capacitor C15 is connected to the non-inverting input terminal of the OP amplifier 14 via the switch S17 and is also connected to the ground line Lg via the switch S18. The other terminal of the capacitor C15 is connected to the inverting output terminal of the OP amplifier 14 via the switch S19 and also connected to the ground line Lg via the switch S20.

One terminal of the capacitor C16 is connected to the inverting input terminal of the OP amplifier 14 via the switch S21 and is also connected to the ground line Lg via the switch S22. The other terminal of the capacitor C16 is connected to the non-inverting output terminal of the OP amplifier 14 via the switch S23 and is also connected to the ground line Lg via the switch S24.

According to such a configuration, when the switches S17, S19, S21 and S23 are off, the capacitor C13 is connected between the non-inverting input terminal and the inverting output terminal of the OP amplifier 14 and also the capacitor C14 is connected between the inverting input terminal and the non-inverting output terminal of the OP amplifier 14. In this case, the capacitance value of the feedback capacitor is the capacitance value Cf of the capacitors C13 and C14.

On the other hand, when the switches S17, S19, S21 and S23 are on, the capacitors C13 and C15 are connected in parallel between the non-inverting input terminal and the inverting output terminal of the OP amplifier 14 and also the capacitors C14 and C16 are connected in parallel between the inverting input terminal and the non-inverting output terminal of the OP amplifier 14. In this case, the capacitance value of the feedback capacitor is the capacitance value (=Cf+Cf2) obtained by adding the capacitance value Cf2 of the capacitors C15 and C16 to the capacitance value Cf of the capacitors C13 and C14.

In this way, a feedback capacitor switching unit 15 is configured by the switches S17, S19, S21 and S23 to switch the capacitance value of the feedback capacitor in the present embodiment. In this case, the feedback capacitor switching unit 15 is configured such that the capacitance value of the feedback capacitor increases as the switches S17, S19, S21 and S23 are switched from off to on. The amplification factor of the SC amplifier circuit 12 changes in accordance with the capacitance value of the feedback capacitor. Thus, in the present embodiment, the SC amplifier circuit 12 is configured to switch its amplification factor by switching the capacitance value by the feedback capacitor switching unit 15.

The pairs of capacitors C17 and C18 and the switches S25 to S30 in the differential configuration are configured to apply the aforementioned offset. One terminal of the capacitor C17 is connected to one terminal of the capacitor C15. A reference voltage Vrp (for example, +5 V) can be applied to the other terminal of the capacitor C17 through the switch S25, and the reference voltage Vcm can be applied to the other terminal of the capacitor C17 through the switch S26, and further a reference voltage Vrm (for example, 0 V) can be applied to the other terminal of the capacitor C17 through the switch S27.

One terminal of the capacitor C18 is connected to one terminal of the capacitor C16. The reference voltage Vrp can be applied to the other terminal of the capacitor C18 through the switch S28, and the reference voltage Vcm can be applied to the other terminal of the capacitor C18 through the switch S29, and further the reference voltage Vrm can be applied to the other terminal of the capacitor C18 through the switch S30.

In the above configuration, since high common-mode voltages superimposed on the battery cells 4a to 4c are applied to the capacitors C11 and C12 and the circuit elements disposed on the assembled battery 4 side of the capacitors C11 and C12, elements with high withstand voltages that can withstand the voltage are used for these circuit elements, and elements with low withstand voltages are used for other circuit elements. In the present embodiment, at least the capacitors C11 and C12 are constituted by inter-wiring capacitance, thereby achieving a high withstand voltage.

The operation control unit 13 controls the operation of the MUX 11, more specifically, on-off switching of the switches S1 to S8. Further, the operation control unit 13 controls the operation of the SC amplifier circuit 12, more specifically, on-off switching of the switches S11 to S30.

When sensing the voltage of the battery cell 4a or 4b, the operation control unit 13 controls the operation of the MUX 11 so as to output a voltage of the battery cell 4a or 4b, and also controls the operation of the SC amplifier circuit 12 so as to switch the amplification factor to the first amplification factor. Further, at this time, the operation control unit 13 controls the operation of the SC amplifier circuit 12 so as to apply the above-mentioned offset. Such a circuit state corresponds to a voltage sensing mode.

When sensing a current flowing in the battery 3 or the assembled battery 4, the operation control unit 13 controls the operation of the MUX 11 so as to output the terminal voltages of the shunt resistors Rs1 or Rs2, and controls the operation of the SC amplifier circuit 12 so as to switch the amplification factor to the second amplification factor. Such a circuit state corresponds to a current sensing mode. In the present embodiment, the first amplification factor is "1" and the second amplification factor is "8" which is higher than the first amplification factor.

In the above configuration, the amplification factor of the SC amplifier circuit 12 can be set to any value depending on the combination of the capacitance values Cs, Cf, Cf2, and Cr of the capacitors C11 to C18, namely the capacitance ratio thereof. In the present embodiment, in order to achieve the above-described first amplification factor and second amplification factor, the capacitance values of the capacitors C11 to C18 are set so as to make the capacitance ratio of the capacitance values Cs, Cf, Cf2, Cr equal to the ratio as shown in the following equation (1).

$$Cf:Cf2:Cs:Cr=0.25:1.75:1:0.5 \quad (1)$$

Furthermore, the operation control unit 13 controls the operation of the SC amplifier circuit 12 so as to execute the sampling twice at every sensing of a voltage. Specifically, the operation control unit 13 controls the operations of the MUX 11 and the SC amplifier circuit 12 so as to sample the input voltage Vip using the capacitor C11 and also to sample the input voltage Vim using the capacitor C12 in one of the two sampling operations.

In addition, the operation control unit 13 controls the operations of the MUX 11 and the SC amplifier circuit 12 so as to sample the input voltage Vip using the capacitor C12 and also to sample the input voltage Vim using the capacitor C11 in the other of the two sampling operations. Hereinafter, such a sensing method will be referred to as "input inversion two time sampling". Although details will be described later, the effect can be obtained so that the sensing error due to the offset of the OP amplifier 14 is reduced by performing the input inversion two time sampling.

Next, the operation of the above configuration will be described with reference to FIGS. 2 to 9. In FIGS. 2 to 9, a symbol of a voltage source representing the offset voltage Vos of the OP amplifier 14 is added to the non-inverting input terminal side of the OP amplifier 14.

[1] Operation for Sensing Voltage of Battery Cell

Here, the operation for sensing the voltage of the battery cell 4a will be described as an example, and also operations for sensing the voltages of other battery cells are the same. When the operation of sensing the voltage of the battery cell 4a is performed, among the switches S1 to S8 of the MUX 11, the switches S1 to S4, S7 and S8 are always turned off and the switches S5 and S6 are always turned on.

When the voltage of the battery cell 4a is detected, the operation of the voltage sensing device 9 is performed in the order of first sampling→first charge transfer (first hold)→second sampling→second charge transfer (second hold). The controller (not shown) executes processing (digital processing) using digital data obtained by A/D conversion of the output voltages Vop and Vom output from the voltage sensing device 9, whereby the voltage of the battery cell 1a is detected.

<First Sampling>

Figure 2:
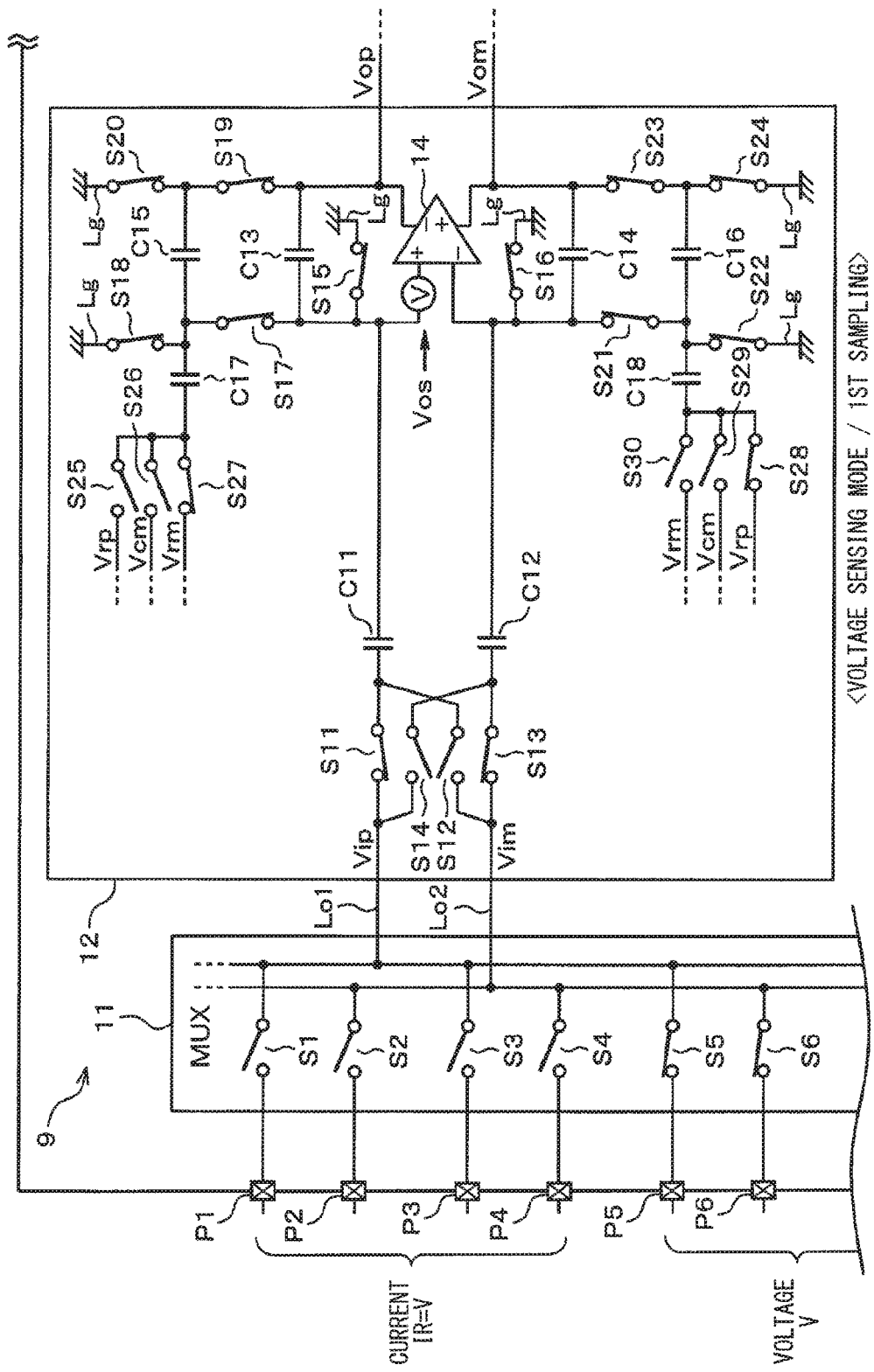
FIG. 2 is a diagram illustrating an operation for sensing a voltage of a battery cell in the first embodiment, and schematically showing a circuit configuration of a voltage sensing device in a first sampling period.

As shown in FIG. 2, the on/off states of the switches S11 to S30 during the period in which a first sampling is performed are as follows.

S11: ON, S12: OFF, S13: ON, S14: OFF, S15: ON, S16: ON

S17: ON, S18: ON, S19: ON, S20: ON

S21: ON, S22: ON, S23: ON, S24: ON

S25: OFF, S26: OFF, S27: ON, S28: ON, S29: OFF, S30: OFF

As a result, the capacitor C11 is charged by the input voltage Vip which is the voltage of the positive terminal of the battery cell 4a, and also the capacitor C12 is charged by the input voltage Vim which is the voltage of the negative terminal of the battery cell 4a. That is, the input voltage Vip is sampled by the capacitor C11 and the input voltage Vim is sampled by the capacitor C12.

The capacitors C13 to C16 are short-circuited between their terminals, so that all the accumulated charges are discharged. Further, the capacitor C17 is charged by the reference voltage Vrm and the capacitor C18 is charged by the reference voltage Vrp.

<First Charge Transfer>

Figure 3:
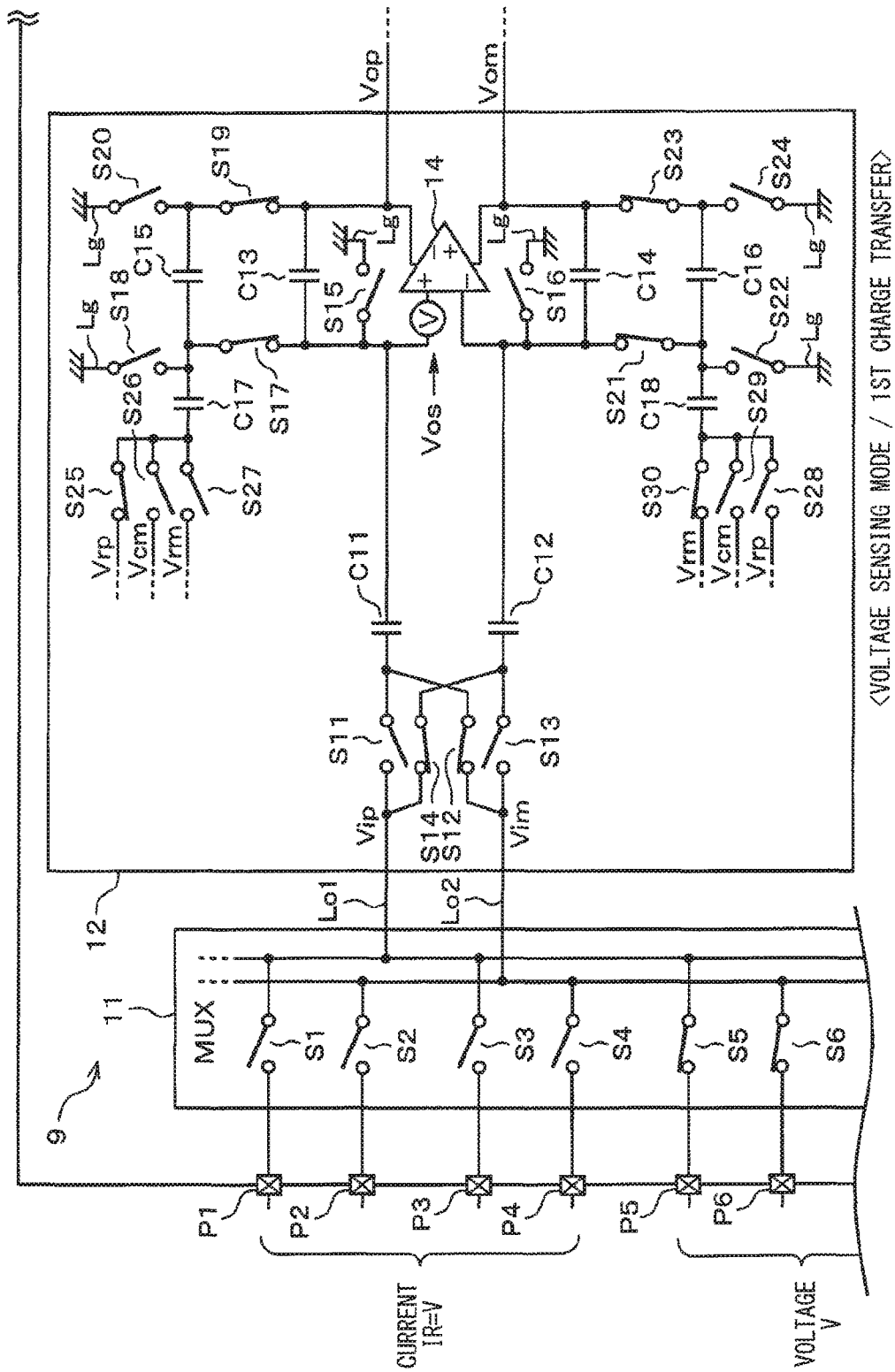
FIG. 3 is a diagram illustrating the operation for sensing the voltage of the battery cell in the first embodiment, and schematically showing the circuit configuration of the voltage sensing device in a first charge transfer period.

As shown in FIG. 3, the on/off states of the switches S11 to S30 during the period in which a first charge transfer is performed are as follows.

S11: OFF, S12: ON, S13: OFF, S14: ON, S15: OFF, S16: OFF

S17: ON, S18: OFF, S19: ON, S20: OFF

S21: ON, S22: OFF, S23: ON, S24: OFF

S25: ON, S26: OFF, S27: OFF, S28: OFF, S29: OFF, S30: ON

As a result, the charge accumulated in the capacitor C11 and the charge accumulated in the capacitor C17 are transferred through the capacitors C13 and C15. In addition, the charge accumulated in the capacitor C12 and the charge accumulated in the capacitor C18 are transferred through the capacitors C14 and C16.

The voltage Vo[1a] which is the difference voltage between the output voltages Vop and Vom output from the voltage sensing device 9 due to such first charge transfer is expressed by the following equation (2). Here, Vi is the difference voltage between the input voltages Vip and Vim (=Vip−Vim), and Vr is the difference voltage between the reference voltages Vrp and Vrm (=Vrp−Vrm).

$$Vo[1a]=(2 \cdot (Cs \cdot Vi - Cr \cdot Vr)/(Cf+Cf2))+Vos \quad (2)$$

In consideration of the capacitance ratio of the capacitors C11 to C18 shown in the equation (1), the following equation (3) can be derived from the above equation (2).

$$Vo[1a]=Vi-(Vr/2)+Vos \quad (3)$$

The ADC 10 receives the output voltages Vop and Vom obtained by the first charge transfer to perform A/D conversion, and outputs digital data corresponding to the voltage Vo[1a], which is the difference voltage, to the controller (not shown). The value "−(Vr/2)" in the above equation (3) corresponds to an offset intentionally given so that the voltage input to the ADC 10 falls within the input voltage range.

In the present embodiment, since the voltage Vr (=Vrp−Vrm) is +5 V, this offset is −2.5 V. Further, in the present embodiment, it is assumed that the voltage between the terminals of the battery cell 4a or the like has a voltage value in the range of 0 V to +5 V. Therefore, by providing such an offset, the voltage input to the ADC 10 falls within the input voltage range (−2.5 V to +2.5 V) of the ADC 10.

<Second Sampling>

Figure 4:
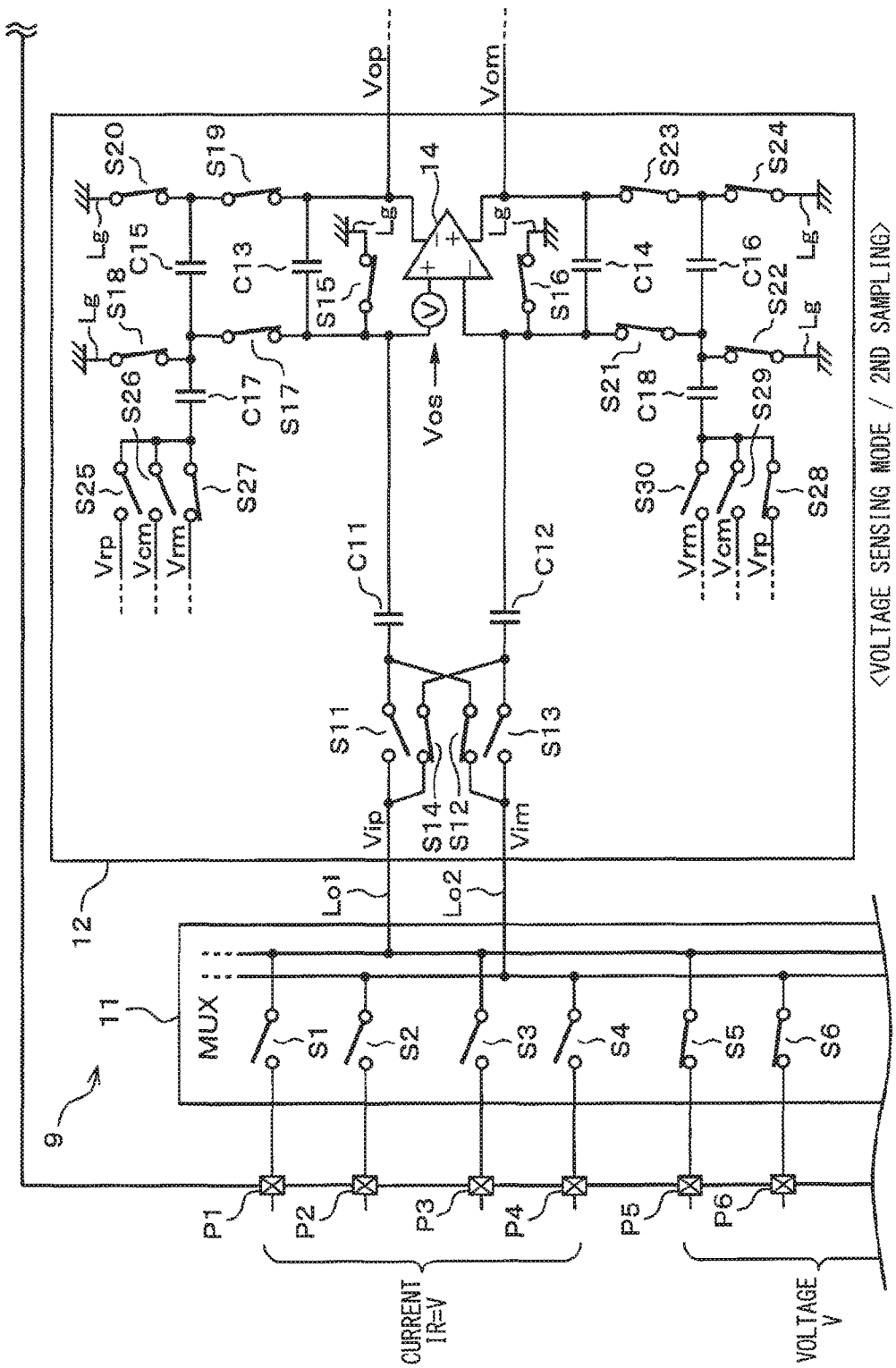
FIG. 4 is a diagram illustrating the operation for sensing the voltage of the battery cell in the first embodiment, and schematically showing the circuit configuration of the voltage sensing device in a second sampling period.

As shown in FIG. 4, the on/off states of the switches S11 to S30 during the period in which a second sampling is performed are as follows.

S11: OFF, S12: ON, S13: OFF, S14: ON, S15: ON, S16: ON
S17: ON, S18: ON, S19: ON, S20: ON
S21: ON, S22: ON, S23: ON, S24: ON
S25: OFF, S26: OFF, S27: ON, S28: ON, S29: OFF, S30: OFF

As a result, the capacitor C11 is charged by the input voltage Vim which is the voltage of the negative terminal of the battery cell 4a, and also the capacitor C12 is charged by the input voltage Vip which is the voltage of the positive terminal of the battery cell 4a. That is, the input voltage Vim is sampled by the capacitor C11 and the input voltage Vip is sampled by the capacitor C12. As described above, the input to the SC amplifier circuit 12 is inverted in the second sampling with respect to the first sampling.

The capacitors C13 to C16 are short-circuited between their terminals, so that all the accumulated charges are discharged. Further, the capacitor C17 is charged by the reference voltage Vrm and the capacitor C18 is charged by the reference voltage Vrp.

<Second Charge Transfer>

Figure 5:
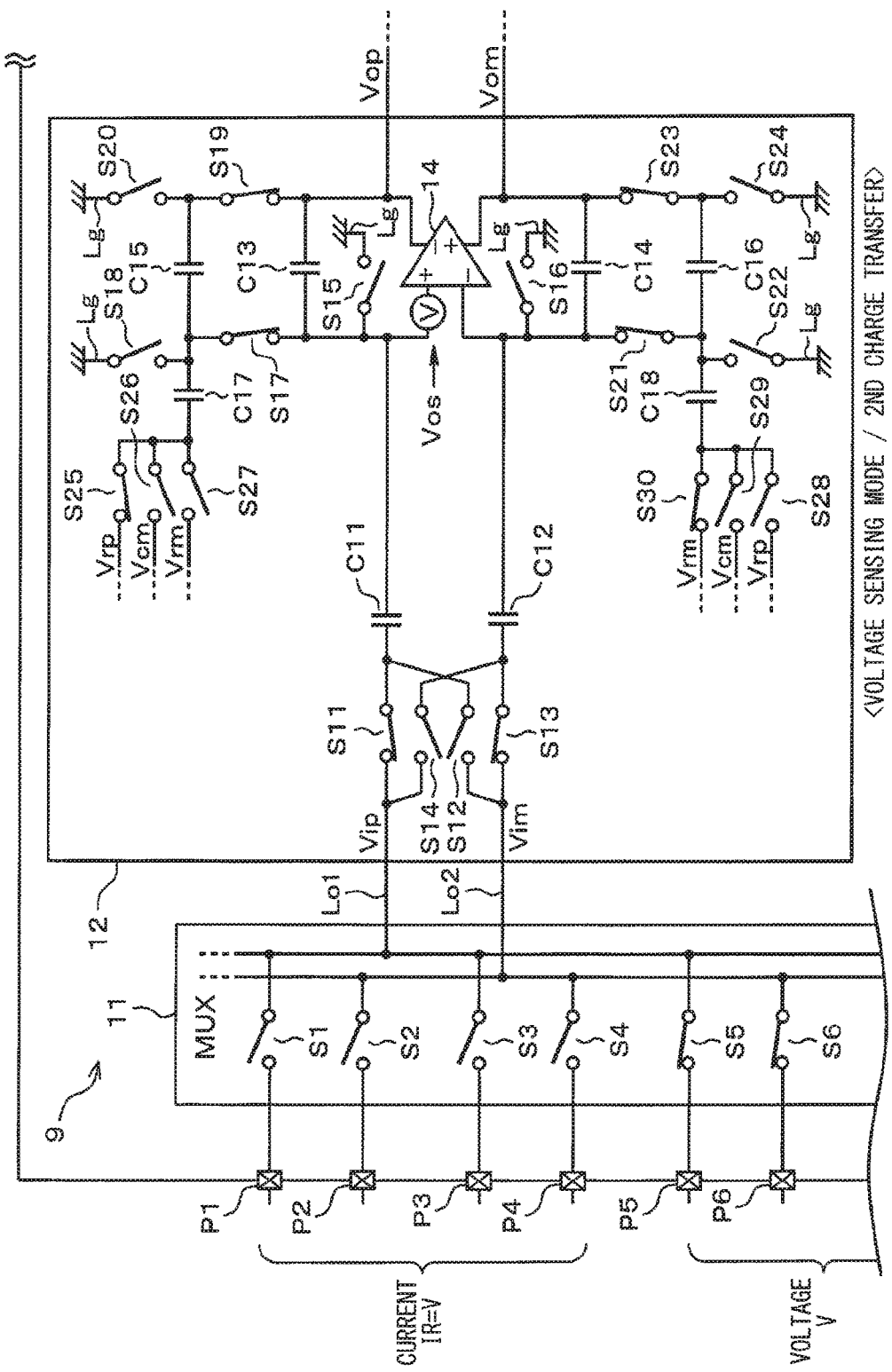
FIG. 5 is a diagram illustrating the operation for sensing the voltage of the battery cell in the first embodiment, and schematically showing the circuit configuration of the voltage sensing device in a second charge transfer period.

As shown in FIG. 5, the on/off state of the switches S11 to S30 during the period in which a second charge transfer is performed are as follows.

S11: ON, S12: OFF, S13: ON, S14: OFF, S15: OFF, S16: OFF
S17: ON, S18: OFF, S19: ON, S20: OFF
S21: ON, S22: OFF, S23: ON, S24: OFF
S25: ON, S26: OFF, S27: OFF, S28: OFF, S29: OFF, S30: ON

As a result, the charge accumulated in the capacitor C11 and the charge accumulated in the capacitor C17 are transferred through the capacitors C13 and C15. In addition, the charge accumulated in the capacitor C12 and the charge accumulated in the capacitor C18 are transferred through the capacitors C14 and C16.

The voltage Vo[2a] which is the difference voltage between the output voltages Vop and Vom output from the voltage sensing device 9 due to such second charge transfer is expressed by the following equation (4).

$$Vo[2a]=(2\cdot(-Cs\cdot Vi-Cr\cdot Vr)/(Cf+Cf2))+Vos \qquad (4)$$

In consideration of the capacitance ratio of the capacitors C11 to C18 shown in the equation (1), the following equation (5) can be derived from the above equation (4).

$$Vo[2a]=-Vi-(Vr/2)+Vos \qquad (5)$$

The ADC 10 receives the output voltages Vop and Vom obtained by the second charge transfer to perform A/D conversion, and outputs digital data corresponding to the voltage Vo[2a], which is the difference voltage between these output voltages to the controller (not shown). The value "−(Vr/2)" in the above equation (5) corresponds to an offset intentionally given, as in the equation (3).

<Digital Processing>

The controller (not shown) executes processing (calculation) for obtaining the sensing value Va of the voltage between the terminals of the battery cell 4a by using the digital data corresponding to each of the voltages Vo[1a] and Vo[2a]. The sensing value Va obtained by such processing is expressed by the following equation (6).

$$Va=(Vo[1a]-Vo[2a])/2=Vi \qquad (6)$$

A voltage which is one time as high as the input voltage can be obtained as the sensing value Va of the voltage across terminals of the battery cell 4a, as shown in the equation (6). That is, the overall gain in this case is "1". As is apparent from the above equation (6), the sensing value Va does not include the offset voltage Vos of the OP amplifier 14. That is, in this case, offset cancellation of the OP amplifier 14 has been carried out by processing using digital data corresponding to each of the voltage Vo[1a] and the voltage Vo[2a] obtained by performing the input inversion two time sampling.

The controller described above senses the value of voltage across terminals of the battery cell 4a from the sensing value Va. As described above, it is assumed that the voltage across terminals of the battery cell 4a is a voltage value in the range of 0 V to +5 V, in the present embodiment. Further, the resolution of the ADC 10 is 14 bits for example in the present embodiment. Hence, according to the above configuration, the voltage across terminals of the battery cell 4a can be detected in units of 0.3 mV from 0 V to +5 V.

[2] Operation for Sensing Current Flowing in Battery

Here, the operation for sensing the current flowing in the battery 3 will be described as an example, and the operation at the time of sensing the current flowing in the assembled battery 4 is the same. When the operation of sensing the current flowing in the battery 3 is performed, among the switches S1 to S8 of the MUX 11, switches S1 and S2 are always turned on and the switches S3 to S8 are always turned off.

When the current flowing in the battery 3 is detected, the operation of the voltage sensing device 9 is performed in the order of first sampling→first charge transfer (first hold) →second sampling→second charge transfer (second hold). The controller (not shown) executes processing (digital processing) using digital data obtained by A/D conversion of the output voltages Vop and Vom output from the voltage sensing device 9, so that the current flowing into the battery 3 is detected.

<First Sampling>

Figure 6:
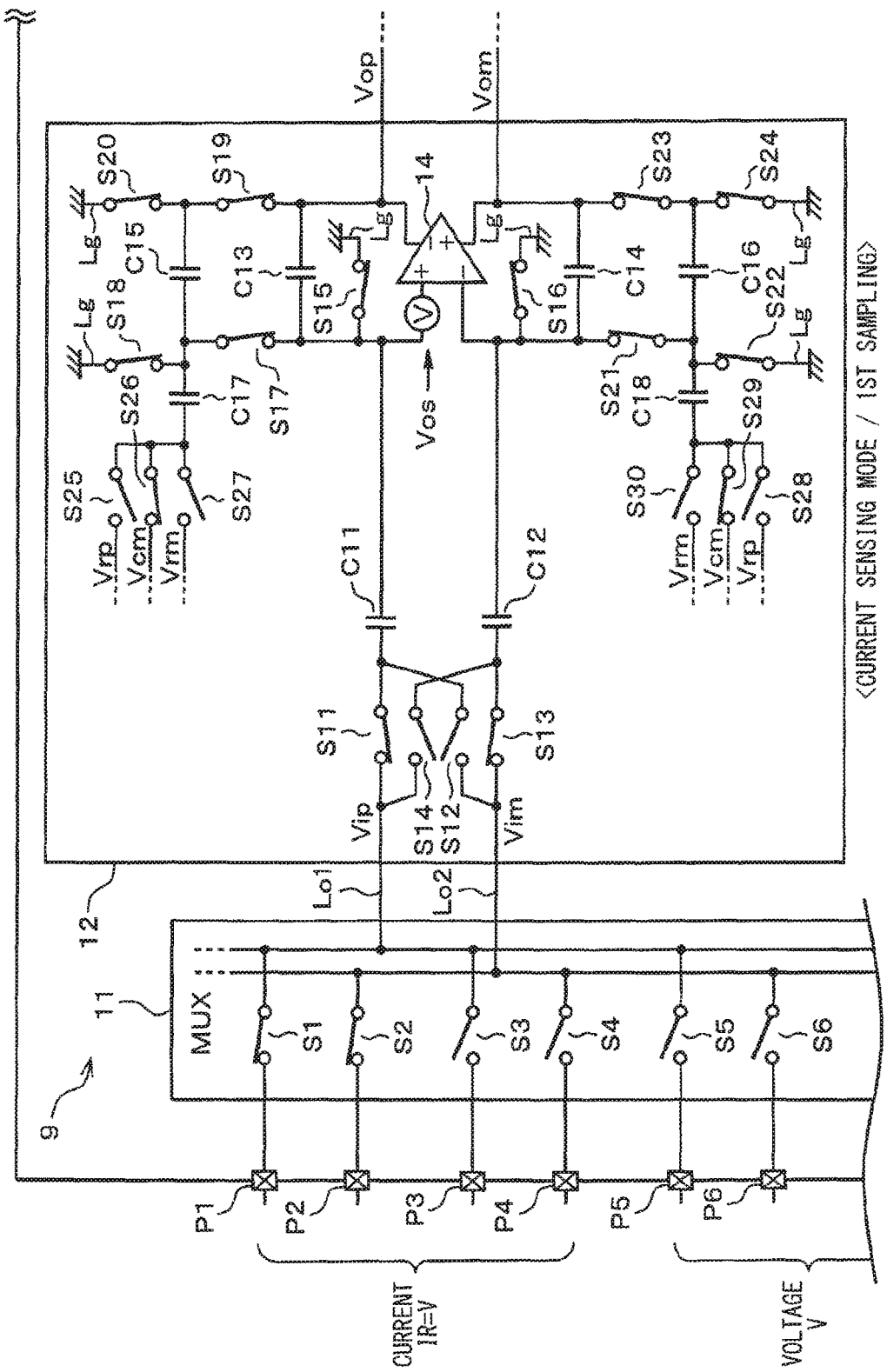
FIG. 6 is a diagram illustrating an operation for sensing a current flowing in a battery in the first embodiment, and schematically showing the circuit configuration of the voltage sensing device in the first sampling period.

As shown in FIG. 6, the on/off states of the switches S11 to S30 during the first sampling period are as follows.

S11: ON, S12: OFF, S13: ON, S14: OFF, S15: ON, S16: ON
S17: ON, S18: ON, S19: ON, S20: ON
S21: ON, S22: ON, S23: ON, S24: ON
S25: OFF, S26: ON, S27: OFF, S28: OFF, S29: ON, S30: OFF

As a result, the capacitor C11 is charged by the input voltage Vip which is the voltage of the high potential side terminal of the shunt resistor Rs1, and the capacitor C12 is charged by the input voltage Vim which is the voltage of the low potential side terminal of the shunt resistor Rs1. That is, the input voltage Vip is sampled by the capacitor C11 and the input voltage Vim is sampled by the capacitor C12. The capacitors C13 to C16 are short-circuited between their terminals, so that all the accumulated charges are discharged. Further, the capacitors C17 and C18 are charged by the reference voltage Vcm, <First Charge Transfer>

Figure 7:
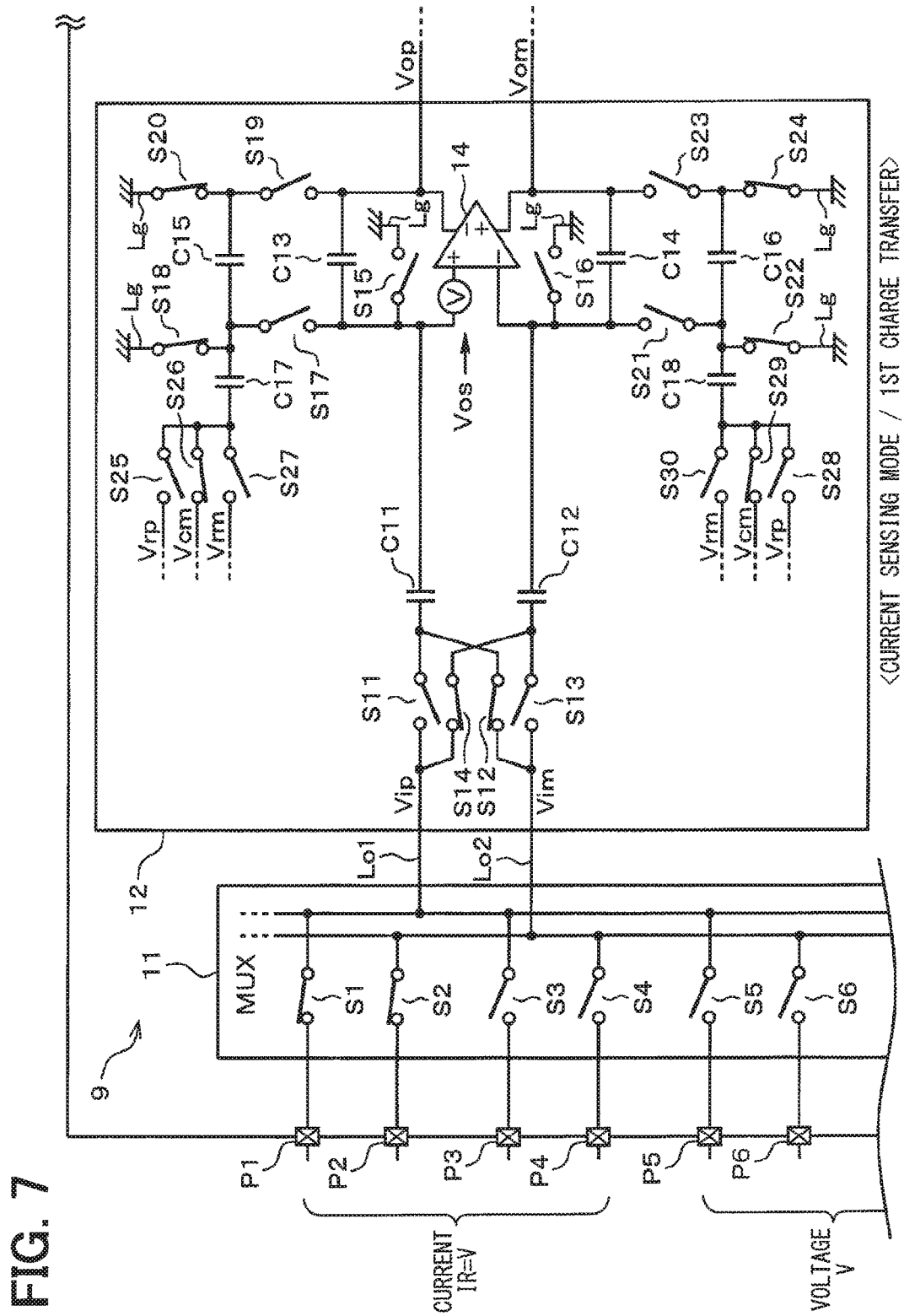
FIG. 7 is a diagram illustrating the operation for sensing the current flowing in the battery in the first embodiment, and schematically showing the circuit configuration of the voltage sensing device in the first charge transfer period.

As shown in FIG. 7, the on/off states of the switches S11 to S30 during the first charge transfer period are as follows.

S11: OFF, S12: ON, S13: OFF, S14: ON, S15: OFF, S16: OFF

S17: OFF, S18: ON, S19: OFF, S20: ON

S21: OFF, S22: ON, S23: OFF, S24: ON

S25: OFF, S26: ON, S27: OFF, S28: OFF, S29: ON, S30: OFF

As a result, the charge accumulated in the capacitor C11 is transferred via the capacitor C13. In addition, the charge accumulated in the capacitor C12 is transferred via the capacitor C14. The voltage Vo[1b], which is the difference voltage between the output voltages Vop and Vom output from the voltage sensing device 9 due to such first charge transfer is expressed by the following equation (7).

$$Vo[1b]=(2\cdot Cs\cdot Vi)/Cf+Vos \qquad (7)$$

In consideration of the capacitance ratio of the capacitors C11 to C18 shown in the equation (1), the following equation (8) can be derived from the equation (7).

$$Vo[1b]=8\cdot Vi+Vos \qquad (8)$$

In this case, as the voltage Vo[1b], a voltage eight times as high as the input voltage can be obtained as shown in the above equation (8). Therefore, the gain in one sampling operation (first sampling and first charge transfer) is "8".

The ADC 10 receives the output voltages Vop and Vom obtained by the first charge transfer to perform A/D conversion, and outputs the digital data corresponding to the voltage Vo[1b] which is the difference voltage between these output voltages to the controller (not shown).

<Second Sampling>

Figure 8:
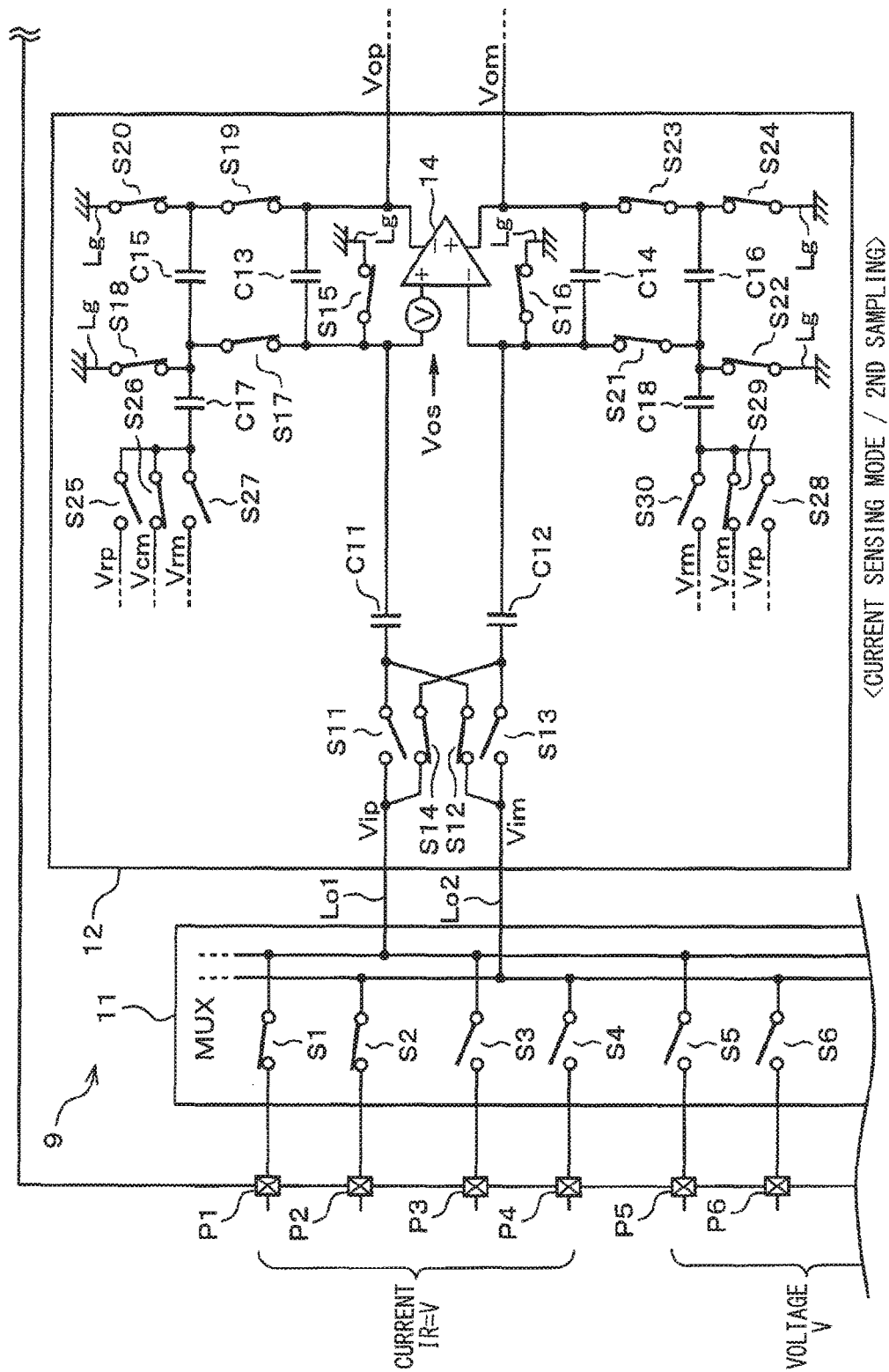
FIG. 8 is a diagram illustrating the operation for sensing the current flowing in the battery in the first embodiment, and schematically showing the circuit configuration of the voltage sensing device in the second sampling period.

As shown in FIG. 8, the on/off states of the switches S11 to S30 during the second sampling period are as follows.

S11: OFF, S12: ON, S13: OFF, S14: ON, S15: ON, S16: ON

S17: ON, S18: ON, S19: ON, S20: ON

S21: ON, S22: ON, S23: ON, S24: ON

S25: OFF, S26: ON, S27: OFF, S28: OFF, S29: ON, S30: OFF

As a result, the capacitor C11 is charged by the input voltage Vim which is the voltage of the low potential side terminal of the shunt resistor Rs1, and the capacitor C12 is charged by the input voltage Vip which is the voltage of the high potential side terminal of the shunt resistor Rs1. That is, the input voltage Vim is sampled by the capacitor C11 and the input voltage Vip is sampled by the capacitor C12. As described above, the input to the SC amplifier circuit 12 is inverted in the second sampling with respect to the first sampling.

The capacitors C13 to C16 are short-circuited between their terminals, so that all the accumulated charges are discharged. Further, the capacitors C17 and C18 are charged by the reference voltage Vcm.

<Second Charge Transfer>

Figure 9:
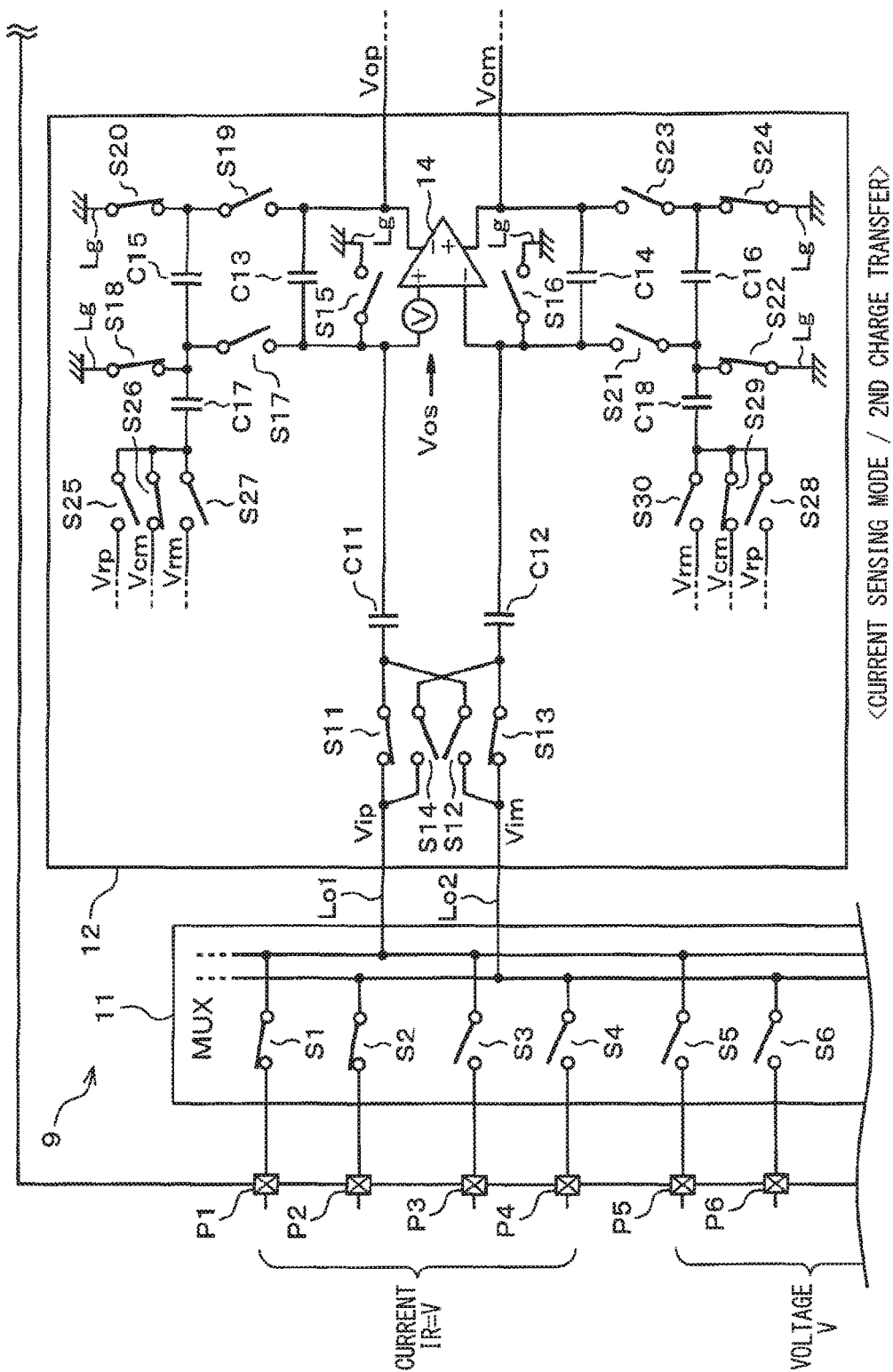
FIG. 9 is a diagram illustrating the operation for sensing the current flowing in the battery in the first embodiment, and schematically showing the circuit configuration of the voltage sensing device in the second charge transfer period.

As shown in FIG. 9, the on/off states of the switches S11 to S30 during the second charge transfer period are as follows.

S11: ON, S12: OFF, S13: ON, S14: OFF, S15: OFF, S16: OFF

S17: OFF, S18: ON, S19: OFF, S20: ON

S21: OFF, S22: ON, S23: OFF, S24: ON

S25: OFF, S26: ON, S27: OFF, S28: OFF, S29: ON, S30: OFF

As a result, the charge accumulated in the capacitor C11 is transferred via the capacitor C13. In addition, the charge accumulated in the capacitor C12 is transferred via the capacitor C14. The voltage Vo[2b] which is the difference voltage between the output voltages Vop and Vom output from the voltage sensing device 9 due to such second charge transfer is expressed by the following equation (9).

$$Vo[2b]=-((2\cdot Cs\cdot Vi)/Cf)+Vos \qquad (9)$$

Considering the capacitance ratio of the capacitors C11 to C18 shown in the equation (1), the following equation (10) can be derived from the above equation (9).

$$Vo[2b]=-8\cdot Vi+Vos \qquad (10)$$

In this case, as the voltage Vo[2b], a voltage eight times as high as the input voltage can be obtained as shown in the above equation (10). That is, the gain in one sampling operation (second sampling and second charge transfer) is "8".

The ADC 10 receives the output voltages Vop and Vom obtained by the second charge transfer to perform A/D conversion, and outputs the digital data corresponding to the voltage Vo[2b] which is the difference voltage between these output voltages to the controller (not shown).

<Digital Processing>

The controller (not shown) executes processing (calculation) for obtaining the sensing value Vb of the voltage across terminals of the shunt resistor Rs1 using the digital data corresponding to each of the voltage Vo[1b] and the voltage Vo[2b]. The sensing value Vb obtained by such processing is expressed by the following equation (11).

$$Vb=(Vo[1b]-Vo[2b])=16\cdot Vi \qquad (11)$$

In this case, a voltage which is 16 times as high as the input voltage can be obtained as the sensing value Vb of the voltage across terminals of the shunt resistor Rs1, as shown in the above equation (11). That is, the overall gain in this case is "16". As is apparent from the above equation (11), the sensing value Vb does not include the offset voltage Vos of the OP amplifier 14. In other words, in this case, offset cancellation of the OP amplifier 14 has been carried out by processing using digital data corresponding to each of the voltage Vo[1b] and the voltage Vo[2b] obtained by performing the input inversion two time sampling.

The controller obtains the current value of the current flowing to the battery 3 from the sensing value Vb by referring to resistance value of the shunt resistor Rs1 or a table showing the correspondence relationship between, for example, the voltage across terminals of the shunt resistor Rs1 and the current, which are stored in advance in the memory or the like. In the present embodiment, it is assumed that the current flowing through the battery 3 has a current value in the range of −500 A to +500 A. Further, in the present embodiment, the resistance value of the shunt resistor Rs1 is set to 0.1 mΩ.

Therefore, the sensing value Vb becomes −800 mV when the current flowing in the battery 3 is −500 A, and becomes +800 mV when the current flowing in the battery 3 is +500 A. As described above, the resolution of the ADC 10 is 14 bits for example, in the present embodiment. Therefore, according to the above configuration, the current flowing in the battery 3 can be detected in units of 0.2 A from −500 A to +500 A.

According to the present embodiment described above, the following effects can be obtained.

The voltage sensing device 9 is switchable between a voltage sensing mode for sensing the voltage across terminals of the battery cell 4a or 4b and a current sensing mode for sensing the current flowing in the battery 3 or the assembled battery 4, and has the MUX 11, SC amplifier circuit 12, and operation control unit 13. The SC amplifier circuit 12 is switchable in its amplification factor. The operation control unit 13 controls the operation of the MUX 11 so as to output the terminal voltages of the battery cells 4a or 4b and also controls the operation of the SC amplifier circuit 12 so as to switch the amplification factor to the first amplification factor (=1) thereby switching to the voltage sensing mode. The operation control unit 13 controls the operation of the MUX 11 so as to output the respective terminal voltages of the shunt resistor Rs1 for sensing the current in the battery 3 or the shunt resistor Rs2 for sensing the current in the assembled battery 4, and also switches the operation mode to the current sensing mode by controlling the operation of the SC amplifier circuit 12 so as to switch the amplification factor to the second amplification factor (=8) higher than the first amplification factor.

In the above configuration, the respective signal processing paths in the voltage sensing mode and the current sensing mode are paths of "MUX 11→SC amplifier circuit 12" and are the same path. In the above configuration, the voltage sensing mode and the current sensing mode based on the same signal processing path are switched in a time sharing manner. Further, the amplification factor of the SC amplifier circuit 12 in the current sensing mode is switchable to the second amplification factor higher than the first amplification factor which is the amplification factor in the voltage sensing mode. Therefore, according to the above configuration, without requiring a dedicated amplifier for amplifying the voltage across terminals of the shunt resistors Rs1 and Rs2 and a resistor provided in association with the dedicated amplifier, which have been conventionally required, both the voltage across terminals of the battery cells 4a and 4b and the voltage across terminals of the shunt resistors Rs1 and Rs2, which have greatly different values from each other, can be accurately detected.

According to such a configuration, since the amplifier and the resistor are unnecessary, the error caused by these components is reduced, and the power consumption and the circuit area can be reduced. Further, in the above configuration, a circuit is shared for sensing the voltage across terminals of the battery cell 4a or 4b and the current flowing in the battery 3 or the assembled battery 4, so that the circuit scale can be thereby suppressed. As described above, according to the present embodiment, an excellent effect can be obtained so that high-precision detection can be achieved according to the dynamic range of input while an increase in the circuit scale is suppressed.

Further, according to the above configuration, the signal processing paths in the voltage sensing mode and the current sensing mode are each a path in which voltages to be detected are directly sampled, and are the same path. Accordingly, with the above configuration, it becomes possible to detect the voltage and the current in the same sampling cycle, and the accuracy of various kinds or signal processing such as SOC estimation performed using the detected values of a current and a voltage can be improved.

In other words, when SOC is estimated from detected values of a voltage and a current during load fluctuation, a filter is used to eliminate overlapping noise, and if the characteristics of a filter cutoff frequency or the like are different between the voltage and current, behavior of the error due to noise varies and makes it difficult to increase the accuracy of SOC estimation. In the present embodiment, since the signal processing paths in the voltage sensing mode and the current sensing mode are the same path and the voltage and the current can be detected in the same sampling cycle, concern about characteristic deviation of the filter is eliminated, and as a result, the accuracy of the SOC estimation can be improved.

The amplification factor of the SC amplifier circuit 12 changes in accordance with the ratio of the capacitance value of the sampling capacitor to the capacitance value of the feedback capacitor. Therefore, in the present embodiment, the feedback capacitor switching unit 15 that switches the capacitance value of the feedback capacitor is provided, so that the amplification factor of the SC amplifier circuit 12 is changed by switching the capacitance value by the feedback capacitor switching unit 15. According to such a configuration, the amplification factor can be switched only by adding several capacitors and switches to the configuration of a general switched capacitor amplifier circuit, and thus the above-described effect can be obtained while minimizing an increase in the circuit scale.

As described above, the amplification factor of the SC amplifier circuit 12 changes in accordance with the ratio of the capacitance value of the sampling capacitor to the capacitance value of the feedback capacitor. To be specific, as apparent from the above-described equations (2), (4), (7), and (9), the amplification factor of the SC amplifier circuit 12 increases as the capacitance ratio increases so that the capacitance value of the sampling capacitor becomes large as compared to the capacitance value of the feedback capacitor.

However, this capacitance ratio has a close relationship with the amplification band because sampling and charge transfer (hold) operations must be completed within a predetermined period. To be specific, if the capacitance value Cs of the capacitors C11 and C12, which are the sampling capacitors, is increased to a very large value in order to increase the capacitance ratio, the frequency characteristic of the SC amplifier circuit 12 deteriorates, that is, the amplifier band narrows. The closed-loop bandwidth of the SC amplifier circuit 12 is proportional to the feedback factor 3.

In the configuration of the present embodiment, the feedback factor βi in the current sensing mode and the feedback factor βv in the voltage sensing mode can be expressed by the following equations (12) and (13), respectively. Here, the capacitance value of the parasitic input capacitor of the OP amplifier 14 is Ci.

$$\beta i = Cf/(Cs+Cf+Ci) \tag{12}$$

$$\beta v = (Cf+Cf2)/(Cs+Cf+Cf2+Ci+Cr) \tag{13}$$

In particular, the amplification factor of the SC amplifier circuit 12 in the current sensing mode is desirably set to a large value because the voltages between terminals of the shunt resistors Rs1 and Rs2 are small. However, in order to increase the amplification factor of the SC amplifier circuit 12, if the capacitance ratio is increased without any reason, the area occupied by the capacitors C11 and C12 serving as sampling capacitors increases, which causes an increase in circuit scale. Further, in this case, since the feedback factor β decreases, the settling characteristic of the SC amplifier circuit 12 deteriorates. In order to suppress such deterioration of the settling characteristic, it is necessary to increase the consumption current of the OP amplifier 14, which makes it difficult to reduce the power consumption of the entire apparatus.

Accordingly, in the present embodiment, a sensing method of input inversion two time sampling is adopted. According to this sensing method, the value "16" as a total amplification factor can be achieved while the amplification factor in one sampling operation is suppressed to "8" in the current sensing mode. In this case, since the capacitance ratio may be set to a value corresponding to "8" which is the amplification factor in one sampling operation, an increase in the capacitance ratio is suppressed. As a result, while an increase in the circuit scale is suppressed, the settling characteristic can be well maintained without increase of the current consumption of the OP amplifier 14, because the feedback factor βi in the current sensing mode becomes a relatively large value.

Further, in the present embodiment, the following effects can be obtained by adopting the sensing method of input inversion two time sampling. That is, offset cancellation of the OP amplifier 14 has been carried out by processing using digital data (digital calculation) corresponding to each of the voltage Vo[1a] and the voltage Vo[2a] obtained by performing input inversion two time sampling. Therefore, according to the present embodiment, the sensing error in the entire battery monitoring apparatus 1 including, for instance, the voltage sensing device 9 and the ADC 10 is reduced, and as a result, the sensing accuracy of the voltage across terminals of the battery cells 4a and 4b and the current flowing through the battery 3 and the assembled battery 4 can be further improved.

In order to carry out the offset cancellation of the OP amplifier 14 like this, an additional amplifier such as an auto zero amplifier has been required. On the other hand, in the present embodiment, offset cancellation of the OP amplifier 14 is carried out by devising the content of processing as described above. Thus, according to the present embodiment, such an additional amplifier becomes unnecessary, and the effect can be obtained so that the circuit area can be suppressed to be thereby smaller than that of the conventional technique.

The SC amplifier circuit 12 provides an offset so that the output voltages Vop and Vom fall within the input voltage range of the ADC 10. When sensing the voltage of the battery cell 4a or 4b, that is, in the voltage sensing mode, the operation control unit 13 controls the operation of the SC amplifier circuit 12 so as to apply the offset described above. In the present embodiment, the voltage across terminals of the battery cell 4a or the like is assumed to be a voltage value in the range of 0 V to +5 V, and thus the above offset is set to −2.5 V. Accordingly, as described above, the dynamic range of the ADC 10 can be fully utilized while ensuring the voltage input to the ADC 10 within the input voltage range by providing the offset in the voltage sensing mode.

Second Embodiment

Hereinafter, a second embodiment will be described with reference to FIGS. 10 to 13.

The voltage sensing method in the second embodiment is different from that in the first embodiment. However, since the configuration is common to the first embodiment, description will be made with reference also to FIG. 1.

As in the first embodiment, the operation control unit 13 of the present embodiment controls the operation of the SC amplifier circuit 12 so as to execute the sampling twice at every sensing of a voltage. However, in this case, the operation control unit 13 controls the operations of the MUX 11 and the SC amplifier circuit 12 so as to sample one of the input voltages Vip and Vim using the capacitor C11 and to sample the other of the input voltages Vip and Vim using the capacitor C12 in one of the two sampling operations.

In the other of the two sampling operations, the operation control unit 13 controls the operations of the MUX 11 and the SC amplifier circuit 12 so as to sample one of the input voltages Vip and Vim using the capacitor C11 and to sample the one of the input voltages Vip and Vim using the capacitor C12. Hereinafter, the details of the sensing method of the present embodiment will be described by taking the operation for sensing the voltage of the battery cell 4a as an example.

In this case, the basic operation and its flow are the same as in the first embodiment. To be specific, the operation of the voltage sensing device 9 is performed in the order of first sampling→first charge transfer→second sampling→second charge transfer. The controller (not shown) executes processing using digital data obtained by A/D conversion of the output voltages Vop and Vom output from the voltage sensing device 9, whereby the voltage of the battery cell 4a is detected.

<First Sampling>

Figure 10:
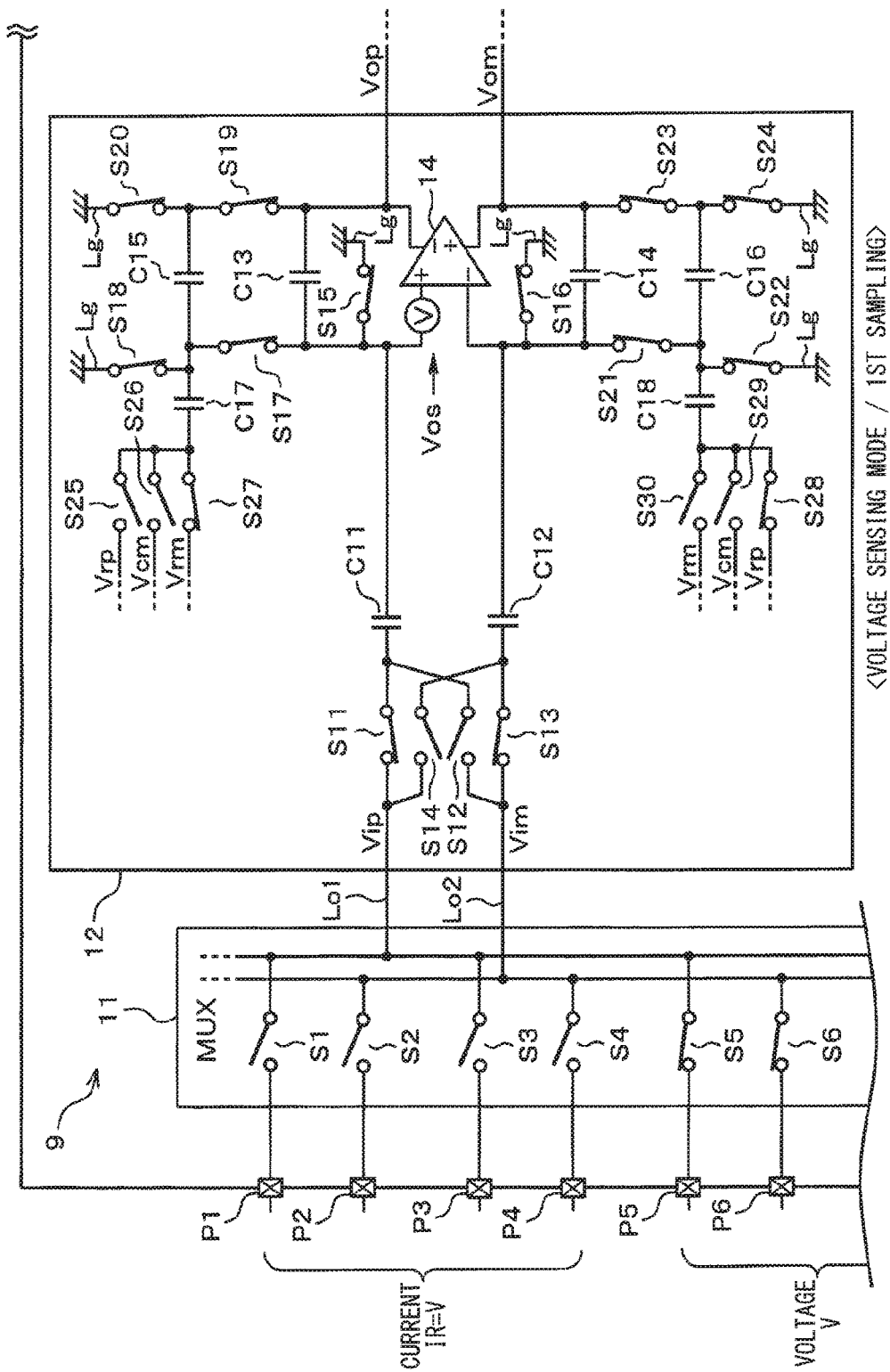
FIG. 10 is a diagram illustrating an operation for sensing a voltage of a battery cell in a second embodiment, and schematically showing the circuit configuration of the voltage sensing device in the first sampling period.

As shown in FIG. 10, the first sampling operation of the present embodiment is the same as the first sampling operation of the first embodiment. Hence, the input voltage Vip is sampled by the capacitor C11 and also the input voltage Vim is sampled by the capacitor C12. Further, the capacitors C13 to C16 are short-circuited between their terminals, so that all the accumulated charges are discharged. Still further, the capacitor C17 is charged by the reference voltage Vrm and the capacitor C18 is charged by the reference voltage Vrp.

<First Charge Transfer>

Figure 11:
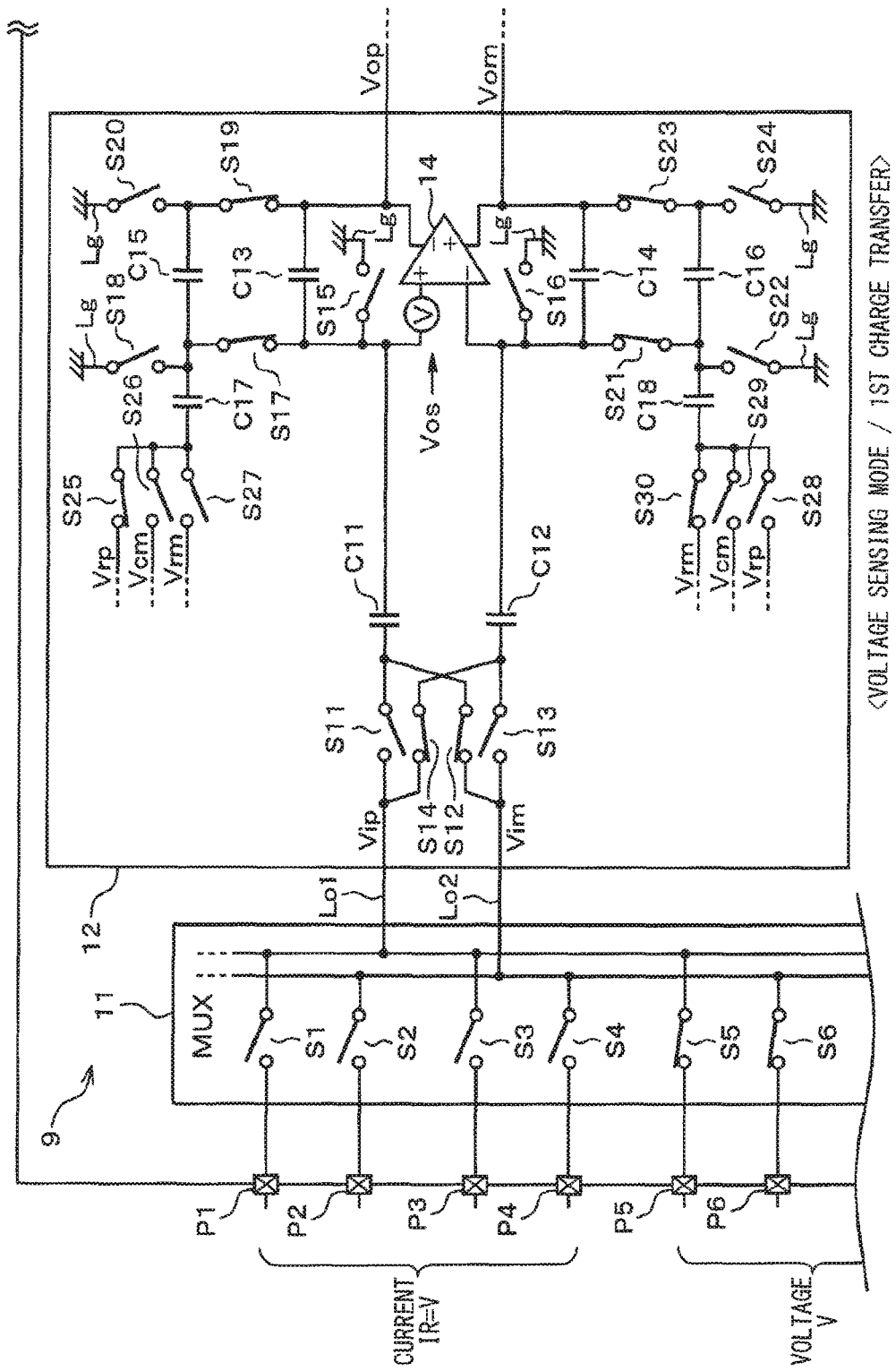
FIG. 11 is a diagram illustrating the operation for sensing the voltage of the battery cell in the second embodiment, and schematically showing the circuit configuration of the voltage sensing device in the first charge transfer period.

As shown in FIG. 11, the operation of the first charge transfer of the present embodiment is the same as the operation of the first sampling of the first embodiment. Thus, the charge accumulated in the capacitor C11 and the charge accumulated in the capacitor C17 are transferred through the capacitors C13 and C15. In addition, the charge accumulated in the capacitor C12 and the charge accumulated in the capacitor C18 are transferred through the capacitors C14 and C16. Due to such first charge transfer, the voltage Vo[1a'], which is the difference voltage between the output voltages Vop and Vom output from the voltage sensing device 9, becomes similar to the voltage Vo[1a] shown in the equations (2) and (3).

<Second Sampling>

Figure 12:
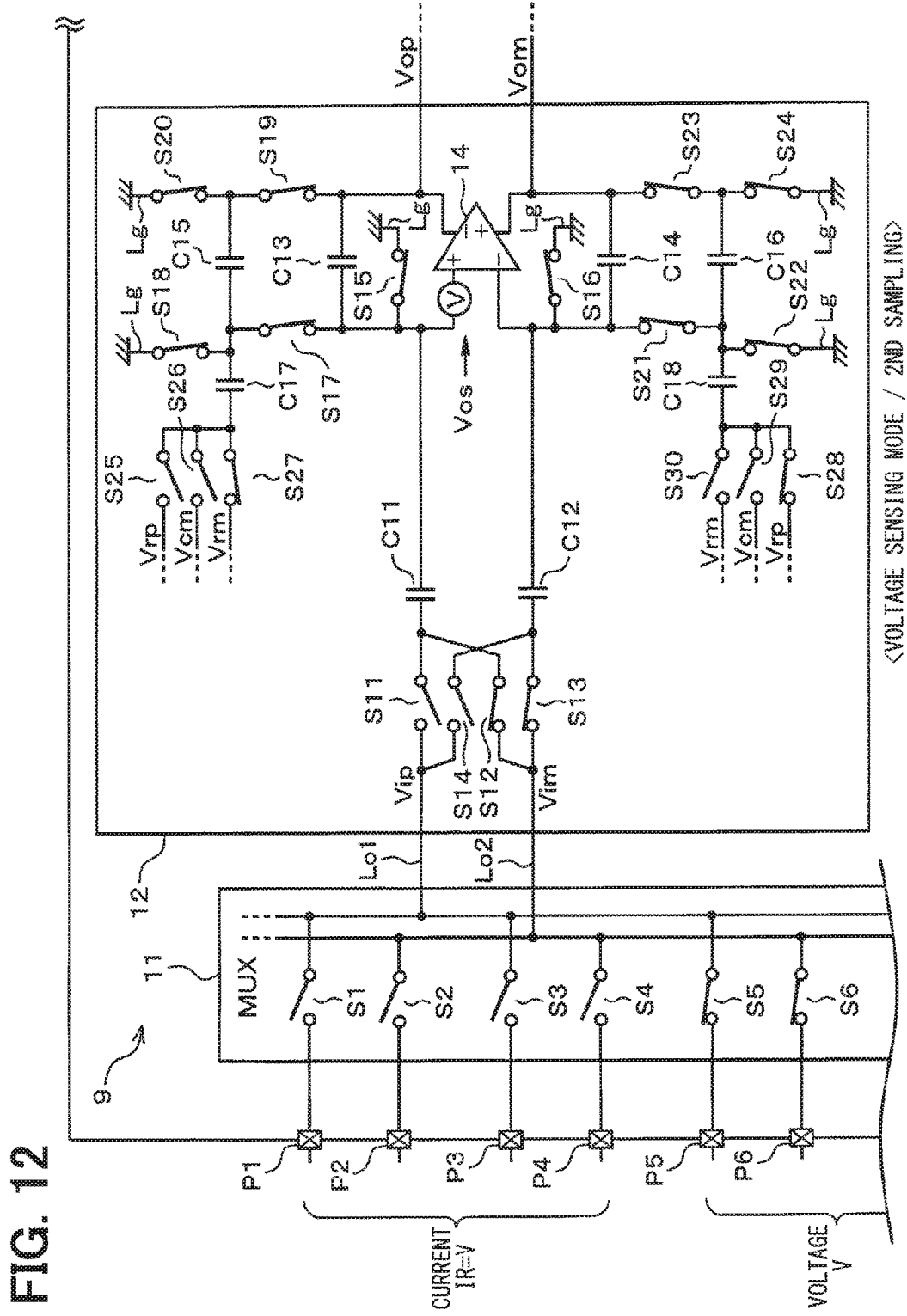
FIG. 12 is a diagram illustrating the operation for sensing the voltage of the battery cell in the second embodiment, and schematically showing the circuit configuration of the voltage sensing device in the second sampling period.

As shown in FIG. 12, the on/off states of the switches S1 to S8 and the switches S11 to S30 during the second sampling period are as follows.

S1: OFF, S2: OFF, S3: OFF, S4: OFF
S5: ON, S6: ON, S7: OFF, S8: OFF
S11: OFF, S12: ON, S13: ON, S14: OFF, S15: ON, S16: ON
S17: ON, S18: ON, S19: ON, S20: ON
S21: ON, S22: ON, S23: ON, S24: ON
S25: OFF, S26: OFF, S27: ON, S28: ON, S29: OFF, S30: OFF

As a result, the capacitors C11 and C12 are both charged by the input voltage Vim which is the voltage of the negative terminal of the battery cell 4a. That is, the input voltage Vim is sampled by the capacitors C11 and C12. The capacitors C13 to C16 are short-circuited between their terminals, so that all the accumulated charges are discharged. Furthermore, the capacitor C17 is charged by the reference voltage Vrm and the capacitor C18 is charged by the reference voltage Vrp.

<Second Charge Transfer>

Figure 13:
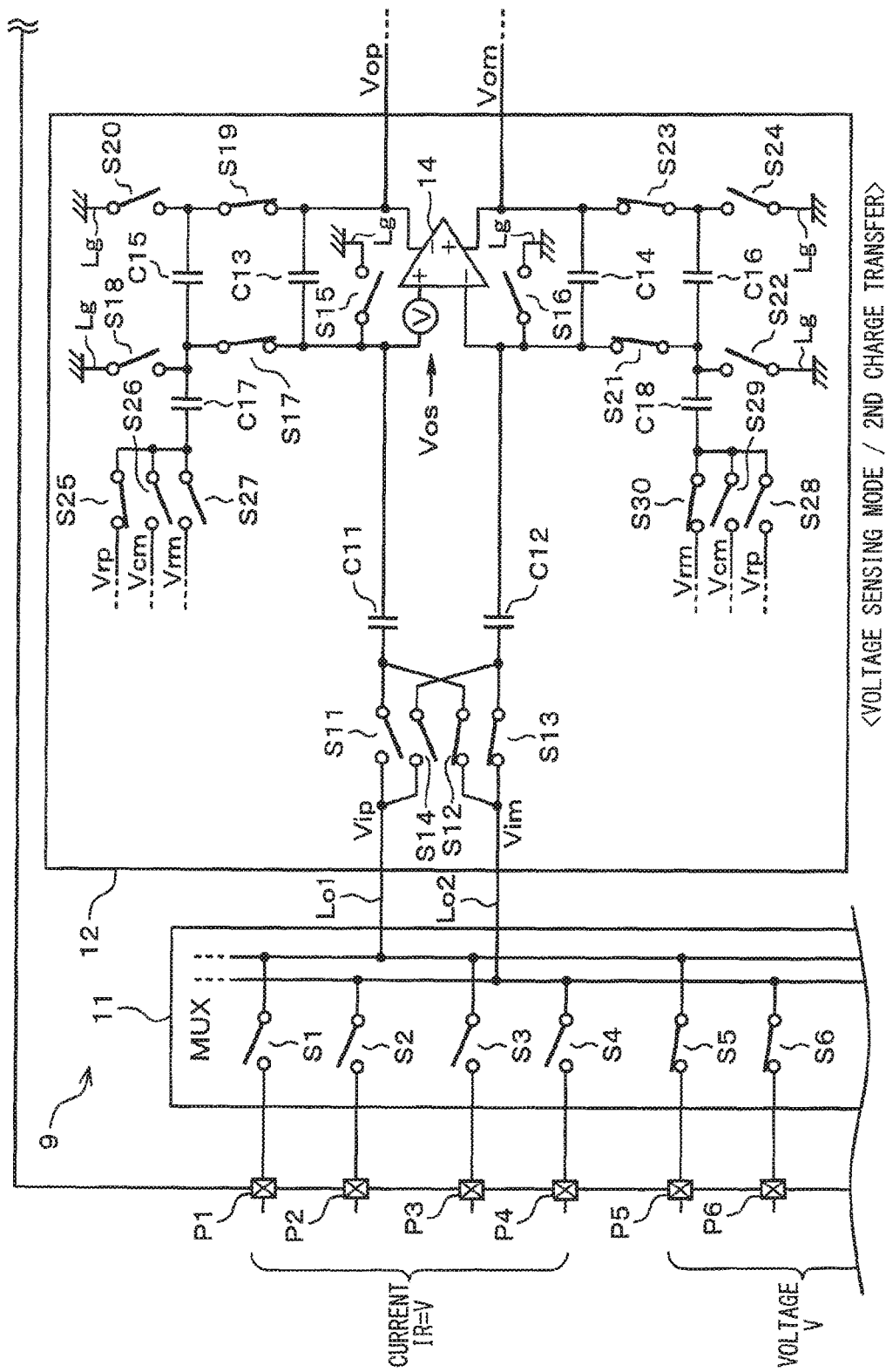
FIG. 13 is a diagram illustrating the operation for sensing the voltage of the battery cell in the second embodiment, and schematically showing the circuit configuration of the voltage sensing device in the second charge transfer period.

As shown in FIG. 13, the on/off states of the switches S1 to S8 and the switches S11 to S30 during the second charge transfer period are as follows.

S1: OFF, S2: OFF, S3: OFF, S4: OFF
S5: ON, S6: ON, S7: OFF, S8: OFF
S11: OFF, S12: ON, S13: ON, S14: OFF, S15: OFF, S16: OFF
S17: ON, S18: OFF, S19: ON, S20: OFF
S21: ON, S22: OFF, S23: ON, S24: OFF
S25: ON, S26: OFF, S27: OFF, S28: OFF, S29: OFF, S30: ON

As a result, during the second sampling and the second charge transfer, the input to the capacitors C11 and C12 is always fixed to have the input voltage Vim, and as a result, the voltage to be detected is zero (0 V). Accordingly, in the second charge transfer, the charge accumulated in the capacitor C17 is transferred via the capacitors C13 and C15, and the charge accumulated in the capacitor C18 is transferred via the capacitors C14 and C16.

The voltage Vo[2a'], which is the difference voltage between the output voltages Vop and Vom output from the voltage sensing device 9 due to such second charge transfer is expressed by the following equation (14).

$$Vo[2a']=(2\cdot(0-Cr\cdot Vr)/(Cf+Cf2))+Vos \quad (14)$$

Considering the capacitance ratio of the capacitors C11 to C18 shown in the equation (1), the following equation (15) can be derived from the above equation (14).

$$Vo[2a']=-(Vr/2)+Vos \quad (15)$$

The ADC 10 receives the output voltages Vop and Vom obtained by the second charge transfer to perform A/D conversion, and outputs the digital data corresponding to the voltage Vo[2a'], which is the difference voltage between these output voltages, to the controller (not shown).

<Digital Processing>

The controller (not shown) performs processing (calculation) for obtaining the sensing value Va' of the voltage between terminals of the battery cell 4a by using the digital data corresponding to each of the voltage Vo[1a'] and the voltage Vo[2a']. The sensing value Va' obtained by such processing is expressed by the following equation (16).

$$Va'=(Vo[1a]-Vo[2a'])=Vi \quad (16)$$

As shown in the above equation (16), the sensing value Va' obtained by the processing of the present embodiment has a value similar to the sensing value Va obtained by the processing of the first embodiment. Therefore, also in the present embodiment, as the sensing value Va' between terminals of the battery cell 4a, a voltage which is one time as high as the input voltage can be obtained. Further, since the sensing value Va' is a similar value to the sensing value Va, the offset voltage Vos of the OP amplifier 14 is not included. That is, the offset cancellation of the OP amplifier 14 has been implemented also in the present embodiment as in the first embodiment.

As described above, the sensing value similar to the voltage sensing method of the first embodiment can be obtained also by the voltage sensing method of the present embodiment. Therefore, the same effect as in the first embodiment can be obtained also according to the present embodiment.

Third Embodiment

Hereinafter, a third embodiment will be described with reference to FIG. 14.

Figure 14:
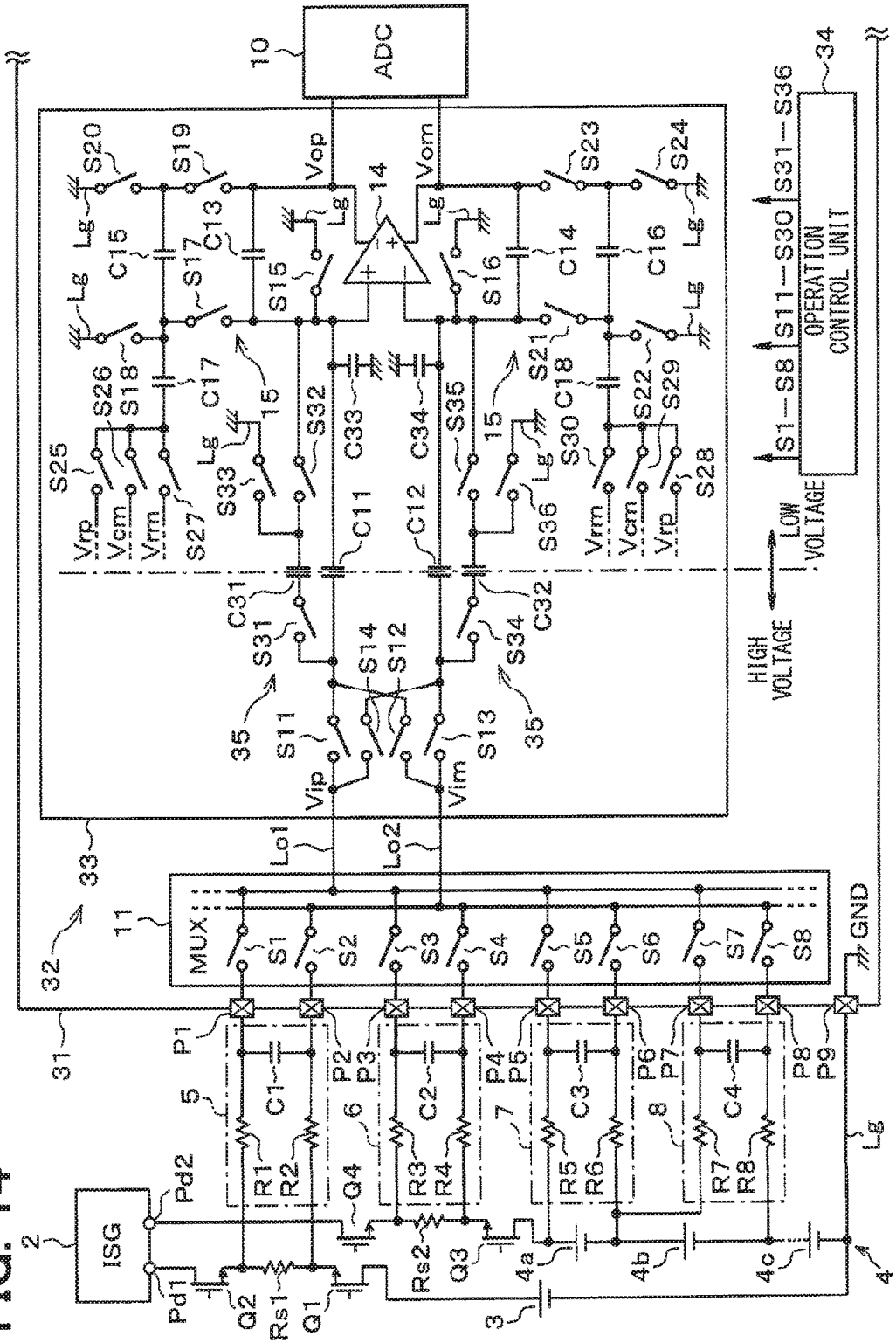
FIG. 14 is a diagram schematically showing a configuration of a battery monitoring apparatus according to a third embodiment.

As shown in FIG. 14, a voltage sensing device 32 included in a battery monitoring apparatus 31 of the present embodiment is different from the voltage sensing device 9 of the first embodiment in that the voltage sensing device 32 is provided with an SC amplifier circuit 33 instead of the SC amplifier circuit 12, and an operation control unit 34 instead of the operation control unit 13.

The SC amplifier circuit 33 differs from the SC amplifier circuit 12 in that capacitors C31 and C32 and switches S31 to S36 are added. FIG. 14 illustrates capacitors C33 and C34 which are parasitic input capacitors existing between each input terminal of the OP amplifier 14 and the ground line Lg and which are omitted in FIG. 1. The capacitors C33 and C34 have the same capacitance value Ci.

The capacitors C31 and C32 form a pair in the differential configuration and have the same capacitance value Csi. One terminal of the capacitor C31 is connected to one terminal of the capacitor C11 via the switch S31 and the other terminal is connected to the other terminal of the capacitor C11 via the switch S32. The other terminal of the capacitor C31 is connected to the ground line Lg via the switch S33.

One terminal of the capacitor C32 is connected to one terminal of the capacitor C12 via the switch S34 and the other terminal is connected to the other terminal of the capacitor C12 via the switch S35. The other terminal of the capacitor C32 is connected to the ground line Lg via the switch S36.

The operation control unit 34 controls on and off of the switches S1 to S8, S11 to S30, and S31 to S36. In this case, the switches S33 and S36 are turned on/off similarly to the switches S15 and S16. On the other hand, the switches S31, S32, S34, and S35 are turned off in the voltage sensing mode and turned on in the current sensing mode.

In the SC amplifier circuit 33 having the above configuration, the capacitors C11 and C12 function as sampling capacitors in the voltage sensing mode, and the parallel combined capacitors of the capacitors C11 and C31 and the parallel combined capacitors of the capacitors C12 and C32 function as sampling capacitors in the current sensing mode. Accordingly, in the present embodiment, the capacitor C31 constitutes a part of the first sampling capacitor in the current sensing mode. Further, the capacitor C32 constitutes a part of the second sampling capacitor in the current sensing mode.

In this way, in the present embodiment, a sampling capacitor switching unit 35 is configured to switch the capacitance value of the sampling capacitor by the switches S31, S32, S34 and S35. In this case, the sampling capacitor switching unit 35 is configured to increase the sampling capacitor by switching the switches S31, S32, S34 and S35 from off to on.

The amplification factor of the SC amplifier circuit 33 varies depending not only on the capacitance value of the feedback capacitor but also on the capacitance value of the sampling capacitor. Therefore, in the present embodiment, a configuration is made so that the amplification factor of the SC amplifier circuit 33 can be switched not only by switching the capacitance value by the feedback capacitor switching unit 15 but also by switching the capacitance value by the sampling capacitor switching unit 35.

In the above configuration, the capacitors C11 to C18 and C31 and C32 are set so that the ratio of the capacitance values Cs, Cf, Cf2, Cr, Csi and Ci (capacitance ratio) of the capacitors C11 to C18 and C31 to C34 becomes the ratio expressed by the following equation (17).

$$Ci:Cf:Cf2:Cs:Csi:Cr=2:1:1:1:3:0.5 \quad (17)$$

In this way, similarly to the first embodiment, the first amplification factor which is the amplification factor of the SC amplifier circuit 33 in the voltage sensing mode is set to "1" and also the second amplification factor which is the amplification factor of the SC amplifier circuit 33 in the current sensing mode can be set to "8".

The same effects as those of the first embodiment can be obtained also according to the present embodiment described above. Further, the following effects are also obtained according to the present embodiment. That is, the feedback factor $\beta i[3]$ in the current sensing mode in the present embodiment can be expressed by the following equation (18).

$$\beta i[3]=Cf/(Cs+Csi+Cf+Ci) \quad (18)$$

Considering the capacitance ratio shown in the equation (17), the feedback factor $\beta i[3]$ in the current sensing mode of the present embodiment is about 0.143.

On the other hand, the feedback factor $\beta i[1]$ in the current sensing mode in the first embodiment is as shown in equation (12). The capacitance ratio in this case is a ratio as shown by the following equation (19) when the parasitic capacitance of the input of the OP amplifier 14 (corresponding to the capacitance value Ci of the capacitors C33 and C34) is taken into consideration.

$$Ci:Cf:Cf2:Cs:Cr=2:0.25:1.75:1:0.5 \quad (19)$$

When the capacitance ratio shown in the above equation (19) is taken into consideration, the feedback factor $\beta i[1]$ in the current sensing mode of the first embodiment is about 0.077.

As described above, according to the present embodiment, the feedback factor in the current sensing mode can be set to a larger value than in the first embodiment. Therefore, according to the present embodiment, an excellent effect can be obtained so that further reduction of the consumption current of the OP amplifier 14 or further improvement of the settling characteristic (speed-up of the sampling) can be achieved.

Fourth Embodiment

Hereinafter, a fourth embodiment will be described with reference to FIGS. 15 to 18.

In the fourth embodiment, the voltage sensing method is different from that in the first embodiment. However, since the configuration is common to the first embodiment, description will be made with reference also to FIG. 1.

Unlike the first embodiment, the operation control unit 13 of the present embodiment controls the operation of the SC amplifier circuit 12 so as to execute sampling once at every sensing of a voltage. Further, in the present embodiment, the capacitance ratio of the capacitors C11 to C18 is set as in the following equation (20).

$$Cf:Cf2:Cs:Cr=0.25:3.75:2:1 \quad (20)$$

[1] Operation for Sensing Voltage of Battery Cell

Here, the operation for sensing the voltage of the battery cell 4a will be described as an example, and also operations for sensing the voltage of other battery cells are the same. When the operation of sensing the voltage of the battery cell 4a is performed, the switches S1 to S8 of the MUX 11 are turned on/off in the same manner as in the first embodiment.

When the voltage of the battery cell 4a is detected, the operation of the voltage sensing device 9 is performed in the order of sampling→charge transfer (hold). The controller (not shown) senses the voltage of the battery cell 4a on the basis of the digital data obtained by A/D conversion of the output voltages Vop and Vom output from the voltage sensing device 9.

(Sampling)

Figure 15:
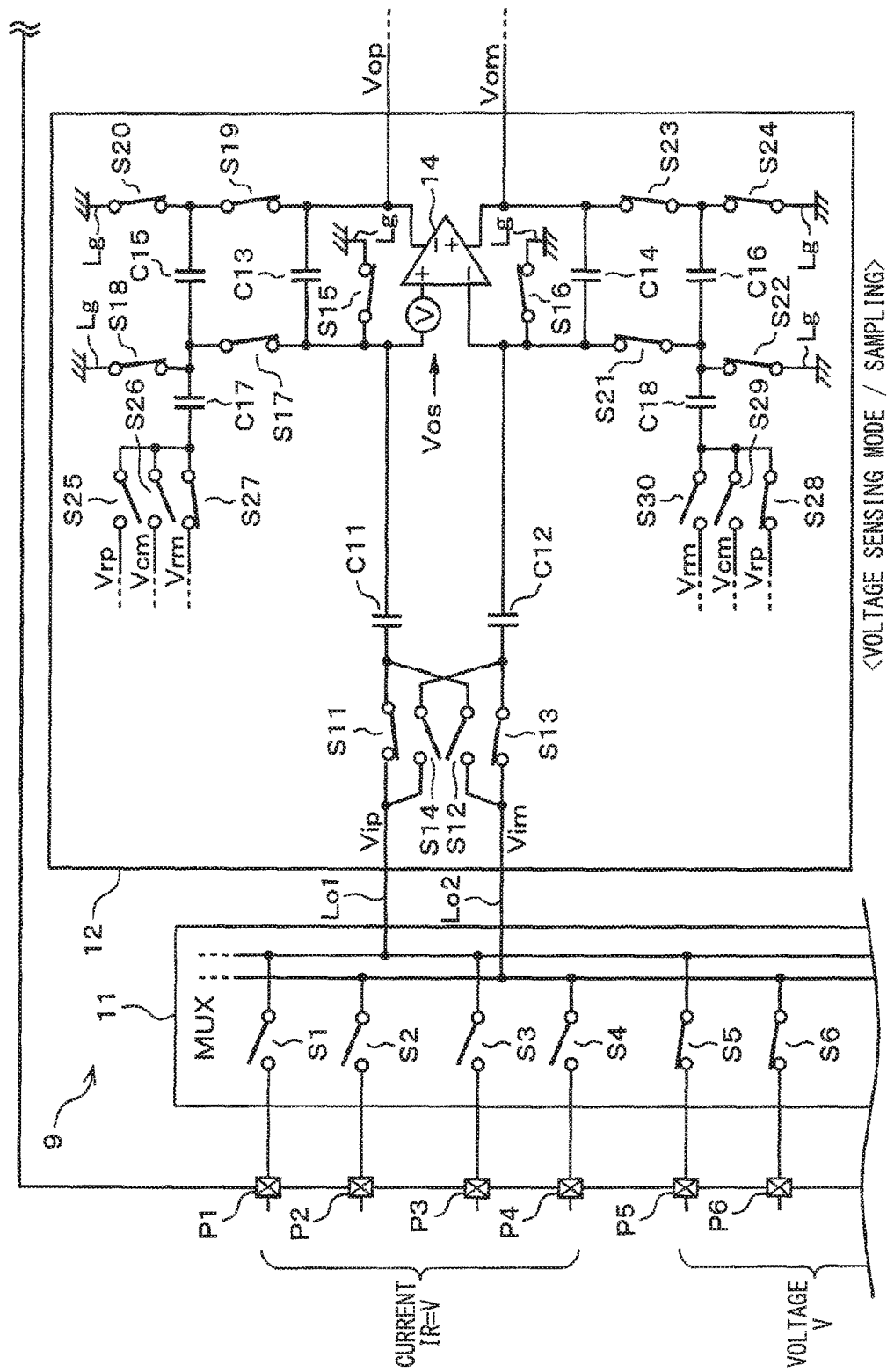
FIG. 15 is a diagram illustrating an operation for sensing a voltage of a battery cell in a fourth embodiment, and schematically showing the circuit configuration of the voltage sensing device in a sampling period.

As shown in FIG. 15, the sampling operation of the present embodiment is the same as the first sampling operation of the first embodiment. Accordingly, the input voltage Vip is sampled by the capacitor C11 and the input voltage Vim is sampled by the capacitor C12. The capacitors C13 to C16 are short-circuited between their terminals, so that all the accumulated charges are discharged. Further, the capacitor C17 is charged by the reference voltage Vrm and the capacitor C18 is charged by the reference voltage Vrp.

(Charge Transfer)

Figure 16:
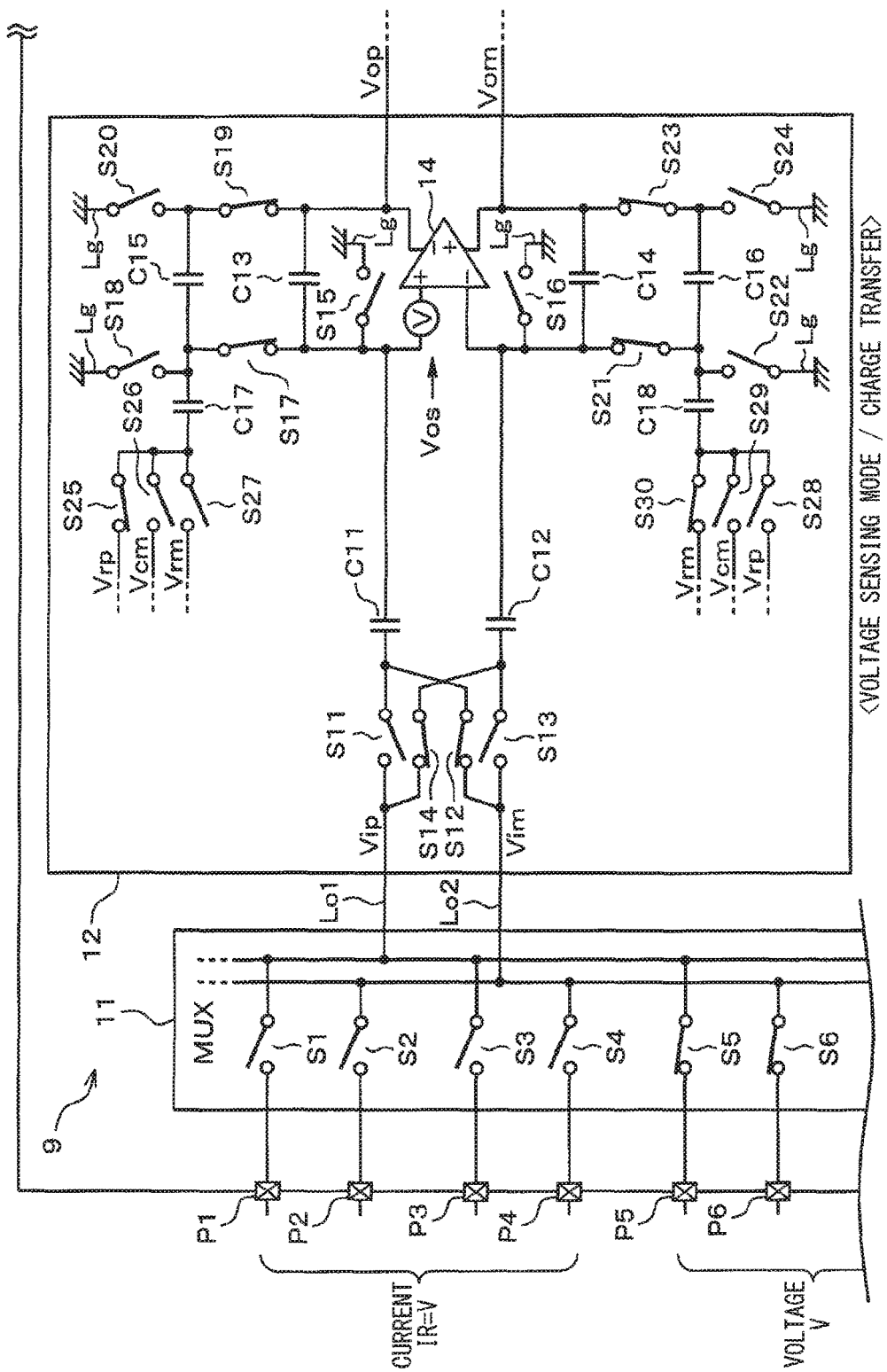
FIG. 16 is a diagram illustrating the operation for sensing the voltage of the battery cell in the fourth embodiment, and schematically showing the circuit configuration of the voltage sensing device in a charge transfer period.

As shown in FIG. 16, the charge transfer operation of the present embodiment is the same as the first charge transfer operation of the first embodiment. Therefore, the charge accumulated in the capacitor C11 and the charge accumulated in the capacitor C17 are transferred through the capacitors C13 and C15. In addition, the charge accumulated in the capacitor C12 and the charge accumulated in the capacitor C18 are transferred through the capacitors C14 and C16. Due to such charge transfer, the voltage Vo[1a] which is the difference voltage between the output voltages Vop and Vom output from the voltage sensing device 9 is as shown in the above equation (2).

Considering the capacitance ratio of the capacitors C11 to C18 shown in the above equation (20), the following equation (21) can be derived from the above equation (2).

$$Vo[1a]=Vi-(Vr/2)+Vos \quad (21)$$

The ADC 10 receives the output voltages Vop and Vom obtained by the charge transfer to perform A/D conversion, and outputs digital data corresponding to the voltage Vo[1a] which is the difference between these output voltages to the controller (not shown).

(Digital Processing)

The controller (not shown) obtains the sensing value of the voltage between terminals of the battery cell 4a on the basis of the digital data corresponding to the voltage Vo[1a]. As shown in the above equation (21), the intentionally given offset "−(Vr/2)" remains in the voltage Vo[1a], but can be easily omitted by calculation and the like because this offset value is already known. However, the sensing value thus obtained includes the offset voltage Vos of the OP amplifier 14, as is apparent from the above equation (21).

[2] Operation for Sensing Current Flowing in Battery

Here, the operation for sensing the current flowing in the battery 3 will be described as an example, but the operation for sensing the current flowing in the assembled battery 4 is the same. When the operation of sensing the current flowing in the battery 3 is performed, the switches S1 to S8 of the MUX 11 are turned on/off in the same manner as in the first embodiment.

When the current flowing in the battery 3 is detected, the operation of the voltage sensing device 9 is performed in the order of sampling→charge transfer (hold). A controller (not shown) senses a current flowing in the battery 3 on the basis of the digital data obtained by A/D conversion of the output voltages Vop and Vom output from the voltage sensing device 9.

(Sampling)

Figure 17:
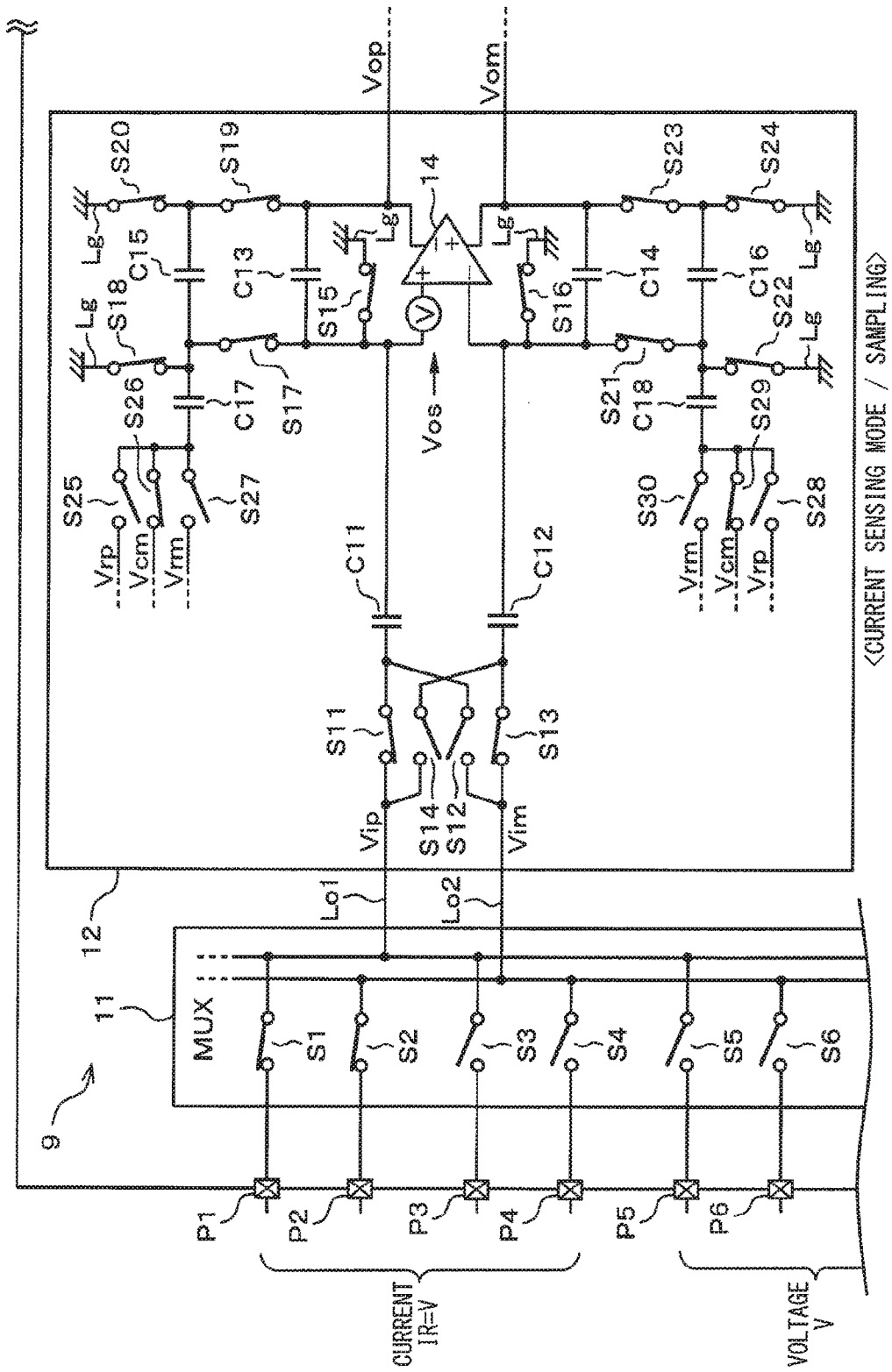
FIG. 17 is a diagram illustrating an operation for sensing a current flowing in a battery in the fourth embodiment, and schematically showing the circuit configuration of the voltage sensing device in the sampling period.

As shown in FIG. 17, the sampling operation of the present embodiment is the same as the first sampling operation of the first embodiment. Hence, the input voltage Vip is sampled by the capacitor C11 and the input voltage Vim is sampled by the capacitor C12. The capacitors C13 to C16 are short-circuited between their terminals, so that all the accumulated charges are discharged. Further, the capacitors C17 and C18 are charged by the reference voltage Vcm, (Charge Transfer)

Figure 18:
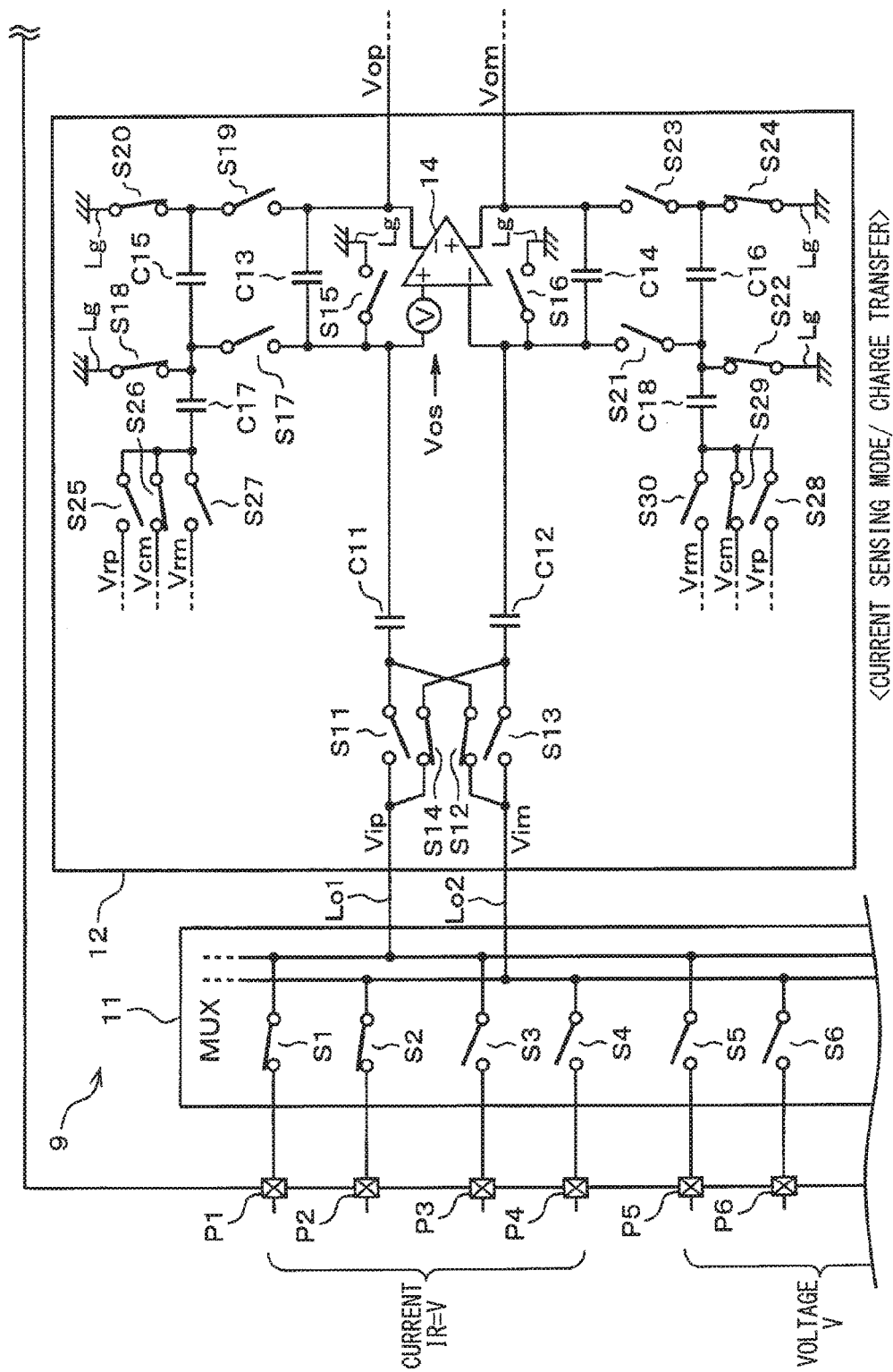
FIG. 18 is a diagram illustrating the operation for sensing the current flowing in the battery in the fourth embodiment, and schematically showing the circuit configuration of the voltage sensing device in the charge transfer period.

As shown in FIG. 18, the charge transfer operation of the present embodiment is the same as the first charge transfer operation of the first embodiment. Therefore, the charge accumulated in the capacitor C11 is transferred via the capacitor C13. In addition, the charge accumulated in the capacitor C12 is transferred via the capacitor C14. Due to such charge transfer, the voltage Vo[1b], which is the difference voltage between the output voltages Vop and Vom output from the voltage sensing device 9, is as shown in the above equation (7).

Considering the capacitance ratio of the capacitors C11 to C18 shown in the equation (20), the following equation (22) can be derived from the equation (7).

$$Vo[1b]=16 \cdot Vi+Vos \quad (22)$$

The ADC 10 receives the output voltages Vop and Vom obtained by the charge transfer to perform A/D conversion, and outputs digital data corresponding to the voltage difference Vo[1b], which is the difference voltage between these output voltages to the controller (not shown).

(Digital Processing)

The controller (not shown) obtains the sensing value of the voltage between terminals of the shunt resistor Rs1 on the basis of the digital data corresponding to the voltage Vo[1b]. The sensing value thus obtained includes the offset voltage Vos of the OP amplifier 14, as is apparent from the above equation (22). In the same manner as in the first embodiment, the controller described above senses the current value of the current flowing through the battery 3 from the detected value of the voltage between terminals of the shunt resistor Rs1.

As described above, according to the present embodiment, effects similar to those of the first embodiment can be obtained. However, the offset cancellation of the OP amplifier 14 cannot be performed only by the voltage sensing method of the present embodiment. Thus, in the present embodiment, it is necessary to additionally provide a configuration (additional capacitor, dedicated control sequence, etc.) for carrying out offset cancellation. However, according to the present embodiment, sampling is performed only once at every sensing of a voltage, so that the speed of sampling is increased as compared with the first embodiment.

Fifth Embodiment

Hereinafter, a fifth embodiment will be described with reference to FIGS. 19 to 25.

Figure 19:
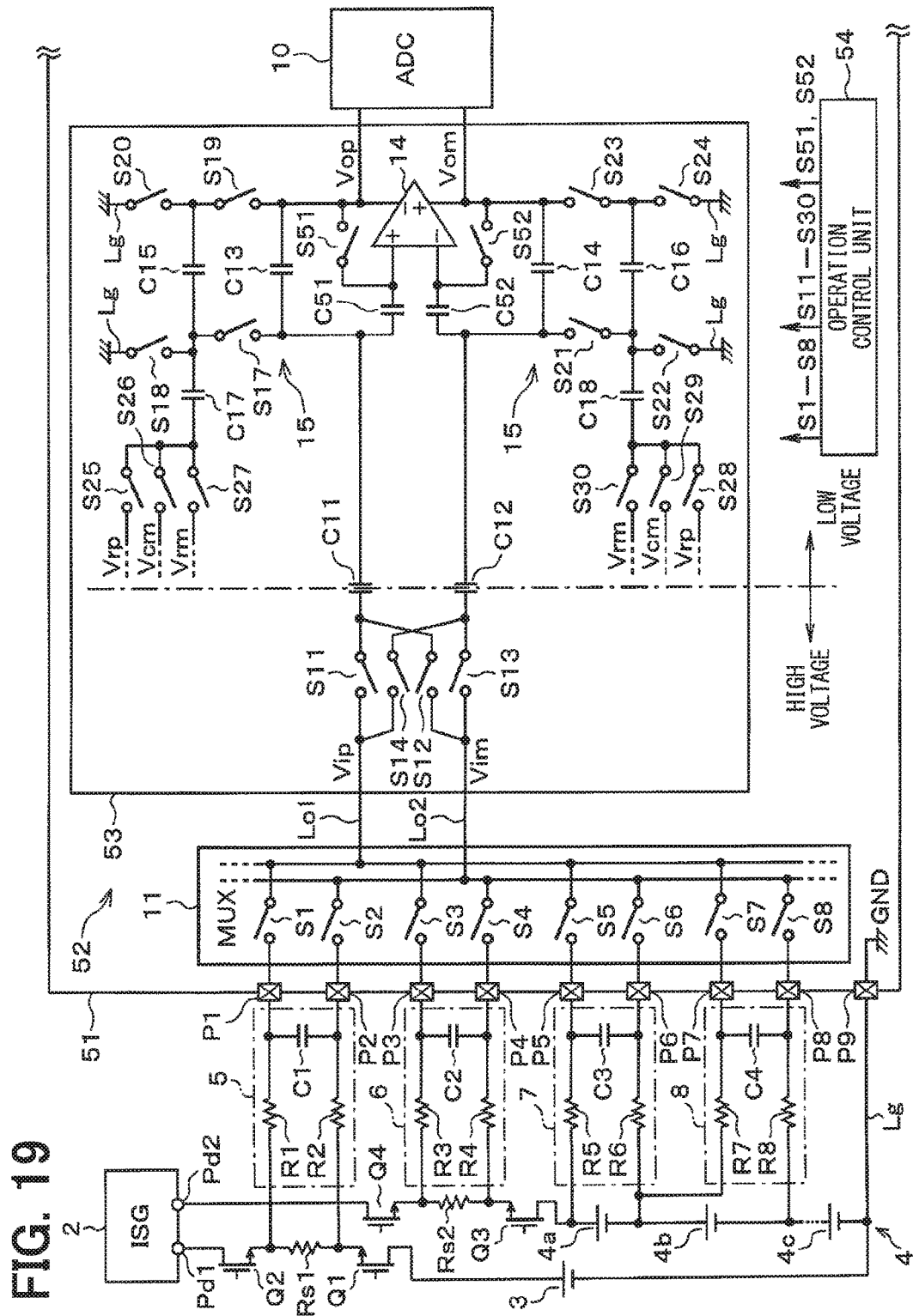
FIG. 19 is a diagram schematically showing a configuration of a battery monitoring apparatus according to a fifth embodiment.

As shown in FIG. 19, a voltage sensing device 52 included in a battery monitoring apparatus 51 of the present embodiment is different from the voltage sensing device 9 of the first embodiment in that the voltage sensing device 52 is provided with an SC amplifier circuit 53 instead of the SC amplifier circuit 12 and an operation control unit 54 instead of the operation control unit 13.

The SC amplifier circuit 53 differs from the SC amplifier circuit 12 in that capacitors C51 and C52 are added, and switches S51 and S52 are provided in place of the switches S15 and S16, and the like. The capacitors C51 and C52 form a pair in the differential configuration and have the same capacitance value Cos.

The capacitor C51 is connected between the capacitor C11 and the non-inverting input terminal of the OP amplifier 14. The capacitor C52 is connected between the capacitor C12 and the inverting input terminal of the OP amplifier 14. The switch S51 is connected between the non-inverting input terminal and the inverting output terminal of the OP amplifier 14. The switch S52 is connected between the inverting input terminal and the non-inverting output terminal of the OP amplifier 14. The operation control unit 54 controls on and off of the switches S1 to S8, S11 to S14, S17 to S30, S51 and S52.

Unlike the first embodiment, the operation control unit 54 of the present embodiment controls the operation of the SC amplifier circuit 53 so as to execute sampling once at every sensing of a voltage. Further, in the present embodiment, the capacitance ratio of the capacitors C11 to C18 is set to be the same ratio as that in the fourth embodiment, namely the ratio shown in the above equation (20).

[1] Operation for Sensing Voltage of Battery Cell

Here, the operation for sensing the voltage of the battery cell 4a will be described as an example, and also operations for sensing the voltage of other battery cells are the same. When the operation of sensing the voltage of the battery cell 4a is performed, the switches S1 to S8 of the MUX 11 are turned on/off in the same manner as in the first embodiment.

When the voltage of the battery cell 4a is detected, the operation of the voltage sensing device 52 is performed in the order of reset→sampling→charge transfer (hold). The controller (not shown) senses the voltage of the battery cell 4a on the basis of the digital data obtained by A/D conversion of the output voltages Vop and Vom output from the voltage sensing device 52.

<Reset>

Figure 20:
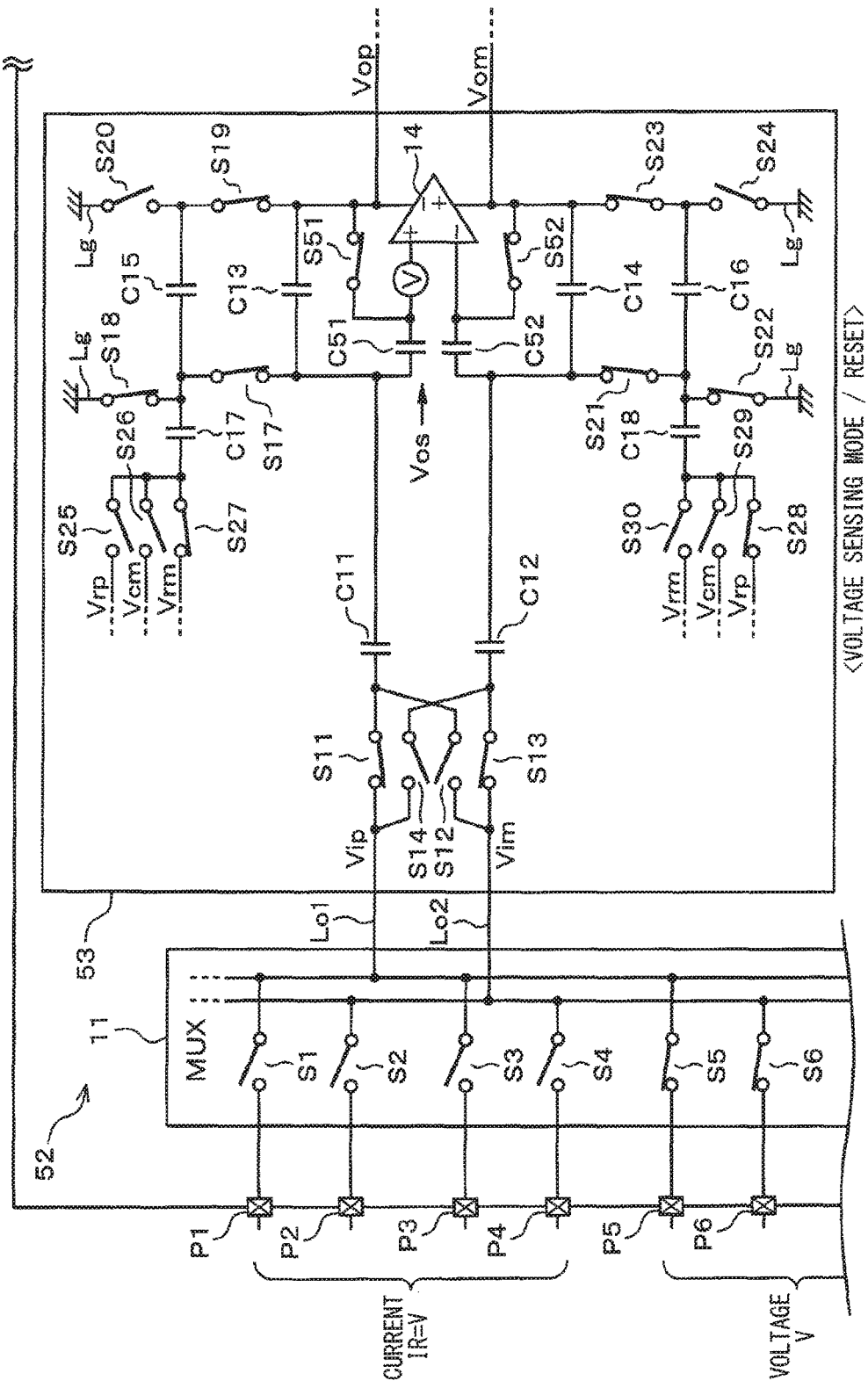
FIG. 20 is a diagram illustrating an operation for sensing a voltage of a battery cell in the fifth embodiment, and schematically showing the circuit configuration of the voltage sensing device in a reset period.

As shown in FIG. 20, the on/off states of the switches S11 to S14, S17 to S30, S51 and S52 during a reset period are as follows.

S11: ON, S12: OFF, S13: ON, S14: OFF
S17: ON, S18: ON, S19: ON, S20: OFF
S21: ON, S22: ON, S23: ON, S24: OFF
S25: OFF, S26: OFF, S27: ON, S28: ON, S29: OFF, S30: OFF
S51: ON, S52: ON

Such a reset period is provided to accumulate the charge corresponding to the offset voltage Vos in the capacitors C51 and C52, that is, to store the offset voltage Vos in the capacitors C51 and C52, before the sampling to be described later. At this time, by turning off the switches S20 and S24, the inverting output terminal and the non-inverting output terminal of the OP amplifier 14 are electrically disconnected from the ground line Lg. This makes it possible to sample the offset voltages of the output voltages Vop and Vom into the capacitors C51 and C52.

<Sampling>

Figure 21:
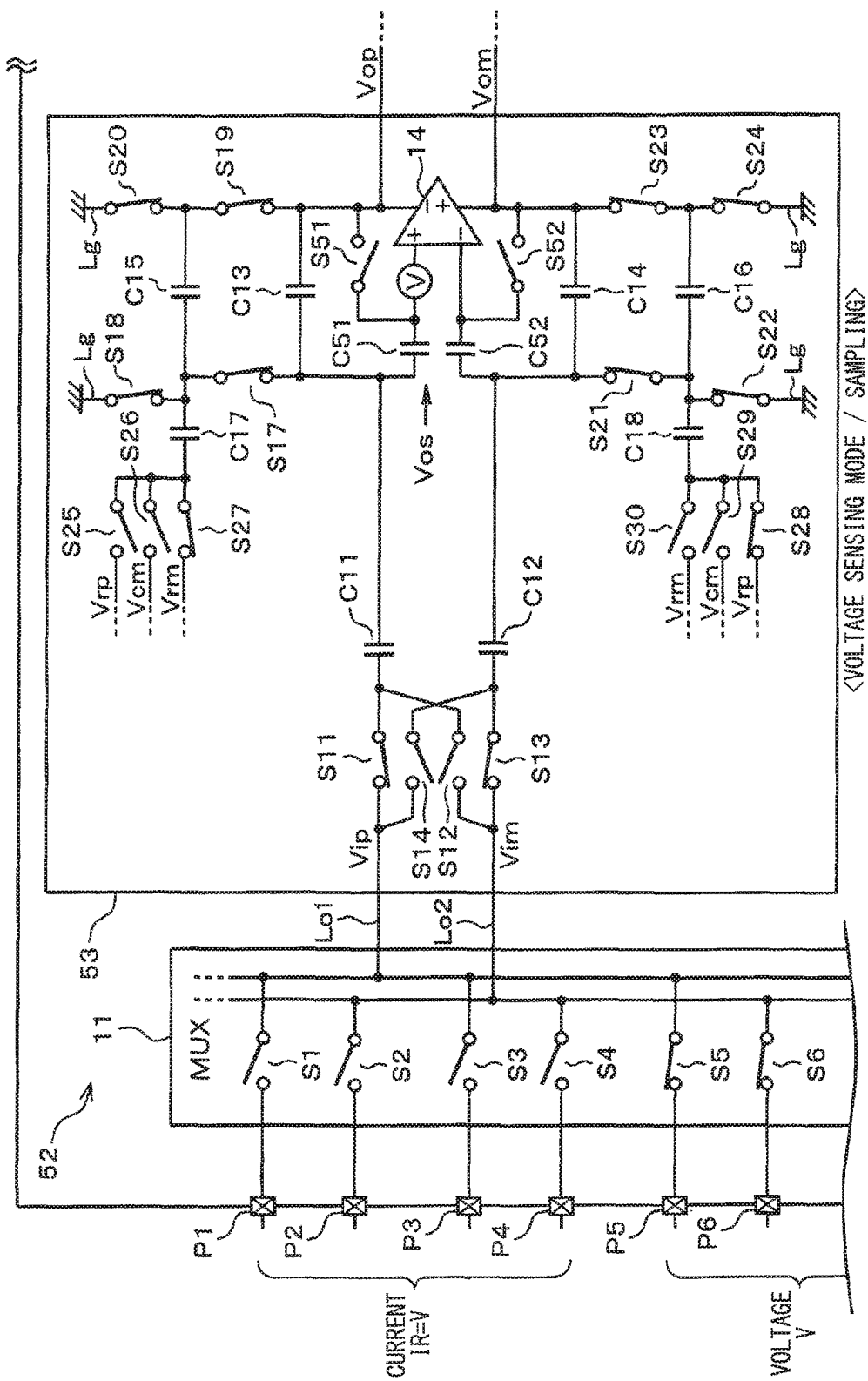
FIG. 21 is a diagram illustrating the operation for sensing the voltage of the battery cell in the fifth embodiment, and schematically showing the circuit configuration of the voltage sensing device in the sampling period.

As shown in FIG. 21, the on/off states of the switches S11 to S14, S17 to S30, S51 and S52 during the sampling period are as follows.

S11: ON, S12: OFF, S13: ON, S14: OFF
S17: ON, S18: ON, S19: ON, S20: ON
S21: ON, S22: ON, S23: ON, S24: ON
S25: OFF, S26: OFF, S27: ON, S28: ON, S29: OFF, S30: OFF
S51: OFF, S52: OFF

As a result, the input voltage Vip is sampled by the capacitor C11 and the input voltage Vim is sampled by the capacitor C12, while the charge corresponding to the offset voltage Vos is accumulated in the capacitors C51 and C52.

In addition, the capacitors C13 to C16 are short-circuited between the terminals so that all the accumulated charges are discharged during time from the reset period until the sampling period. Furthermore, the capacitor C17 is charged by the reference voltage Vrm and the capacitor C18 is charged by the reference voltage Vrp during time from the reset period until the sampling period.

<Charge Transfer>

Figure 22:
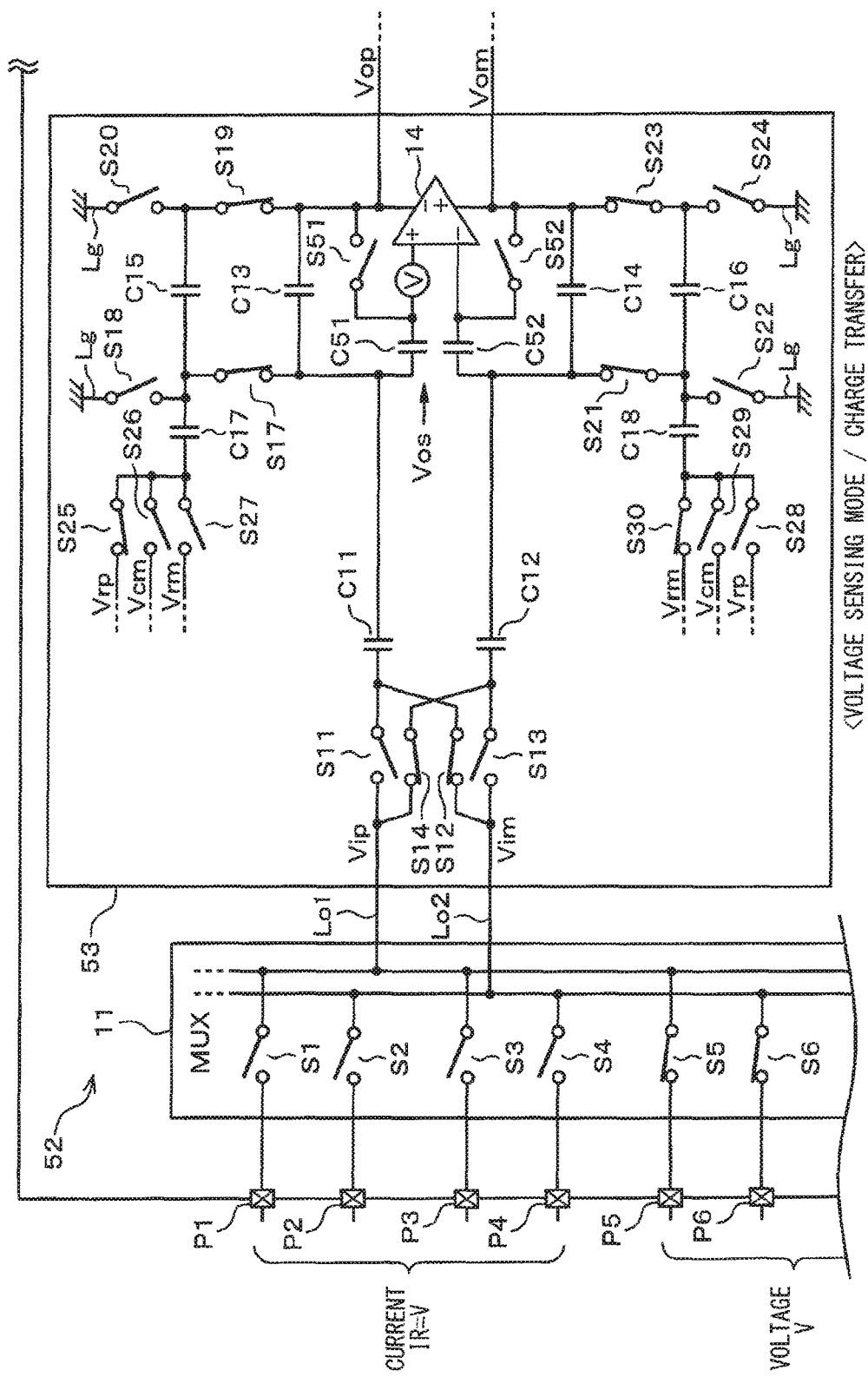
FIG. 22 is a diagram illustrating the operation for sensing the voltage of the battery cell in the fifth embodiment, and schematically showing the circuit configuration of the voltage sensing device in the charge transfer period.

As shown in FIG. 22, the on/off states of the switches S11 to S14, S17 to S30, S51 and S52 during the charge transfer period are as follows.

S11: OFF, S12: ON, S13: OFF, S14: ON
S17: ON, S18: OFF, S19: ON, S20: OFF
S21: ON, S22: OFF, S23: ON, S24: OFF
S25: ON, S26: OFF, S27: OFF, S28: OFF, S29: OFF, S30: ON
S51: OFF, S52: OFF.

As a result, the charges accumulated in the capacitors C11, C17, and C51 are transferred via the capacitors C13 and C15. The charges accumulated in the capacitors C12, C18, and C52 are transferred via the capacitors C14 and C16. The voltage Vo[1a], which is the difference voltage between the output voltages Vop and Vom output from the voltage sensing device 52 due to such charge transfer is expressed by the following equation (23).

$$Vo[1a]=2\cdot(Cs\cdot Vi-Cr\cdot Vr)/(Cf+Cf2) \qquad (23)$$

In the present embodiment, since the offset voltage Vos is sampled by the capacitors C51 and C52, the offset voltages Vos are included in each of the output voltages Vop and Vom. Therefore, as is apparent from the above equation (23), the offset voltage Vos is not included in the voltage Vo[1a] which is the difference voltage between these output voltages.

Considering the capacitance ratio of the capacitors C11 to C18 shown in the above equation (20), the following equation (24) can be derived from the above equation (23).

$$Vo[1a]=Vi-(Vr/2) \qquad (24)$$

The ADC 10 receives the output voltages Vop and Vom obtained by the charge transfer to perform A/D conversion, and outputs the digital data corresponding to the voltage difference Vo[1a], which is the difference voltage between these output voltages to the controller (not shown).

<Digital Processing>

The controller (not shown) obtains the sensing value of the voltage between terminals of the battery cell 4a on the basis of the digital data corresponding to the voltage Vo[1a]. As apparent from the above equations (23) and (24), the sensing value obtained in this way does not include the offset voltage Vos of the OP amplifier 14.

[2] Operation for Sensing Current Flowing in Battery

Here, the operation for sensing the current flowing in the battery 3 will be described as an example, but the operation for sensing the current flowing in the assembled battery 4 is the same. When the operation of sensing the current flowing in the battery 3 is performed, the switches S1 to S8 of the MUX 11 are turned on/off in the same manner as in the first embodiment.

When the current flowing through the battery 3 is detected, the operation of the voltage sensing device 52 is performed in the order of reset→sampling→charge transfer (hold). The controller (not shown) senses the current flowing in the battery 3 on the basis of the digital data obtained by A/D conversion of the output voltages Vop and Vom output from the voltage sensing device 52.

<Reset>

Figure 23:
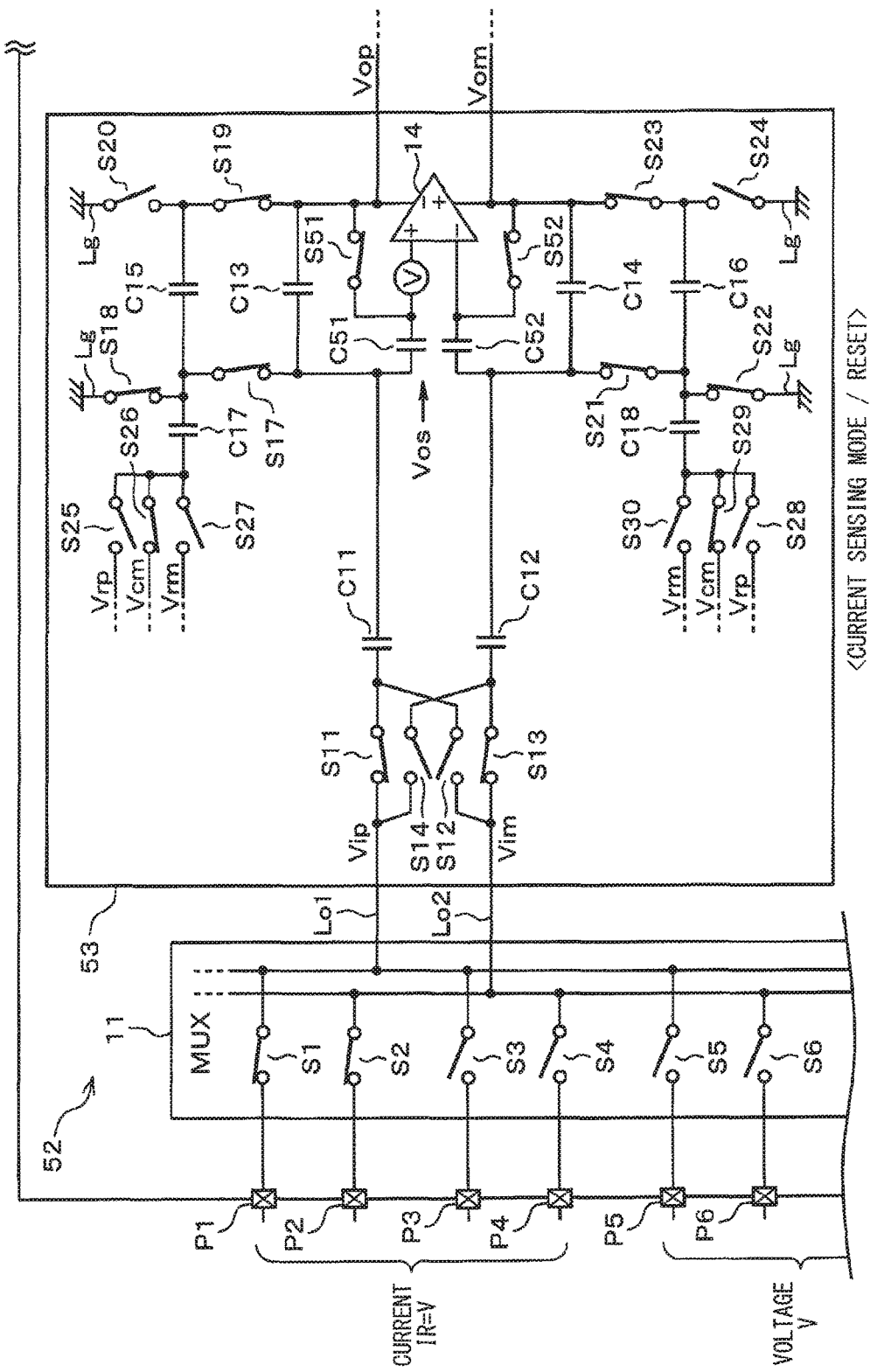
FIG. 23 is a diagram illustrating an operation for sensing a current flowing in a battery in the fifth embodiment, and schematically showing the circuit configuration of the voltage sensing device in the reset period.

As shown in FIG. 23, the on/off states of the switches S11 to S14, S17 to S30, S51, and S52 during the reset period are as follows.

S11: ON, S12: OFF, S13: ON, S14: OFF
S17: ON, S18: ON, S19: ON, S20: OFF
S21: ON, S22: ON, S23: ON, S24: OFF
S25: OFF, S26: ON, S27: OFF, S28: OFF, S29: ON, S30: OFF
S51: ON, S52: ON

Such a reset period is provided to accumulate the charge corresponding to the offset voltage Vos in the capacitors C51 and C52, that is, to store the offset voltage Vos in the capacitors C51 and C52, before the sampling to be described later. At this time, the switches S20 and S24 are turned off for the same reason as that in the reset period for sensing the voltage of the battery cell 4a.

<Sampling>

Figure 24:
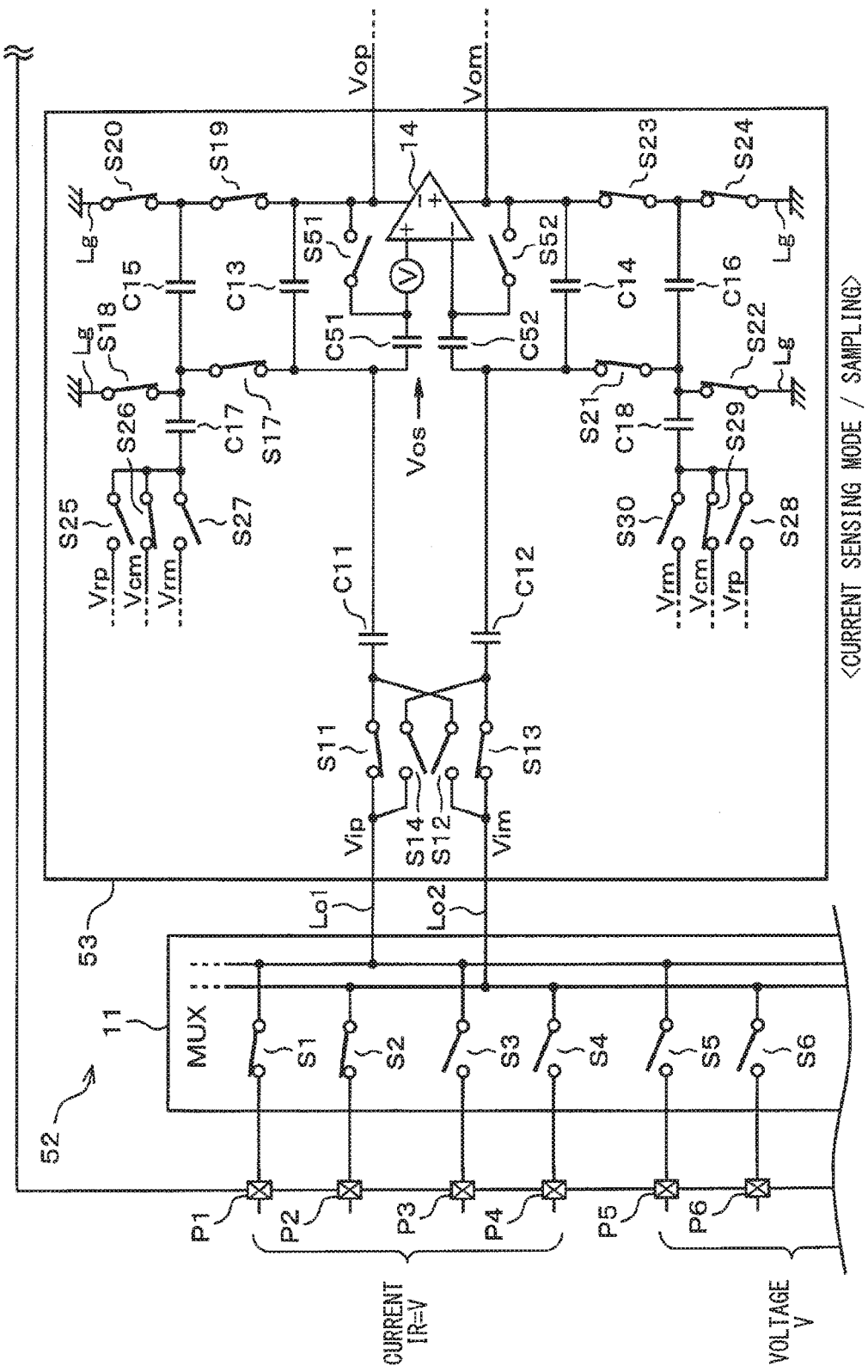
FIG. 24 is a diagram illustrating the operation for sensing the current flowing in the battery in the fifth embodiment, and schematically showing the circuit configuration of the voltage sensing device in the sampling period.

As shown in FIG. 24, the on/off states of the switches S11 to S14, S17 to S30, S51 and S52 during the sampling period are as follows.

S11: ON, S12: OFF, S13: ON, S14: OFF
S17: ON, S18: ON, S19: ON, S20: ON
S21: ON, S22: ON, S23: ON, S24: ON
S25: OFF, S26: ON, S27: OFF, S28: OFF, S29: ON, S30: OFF
S51: ON, S52: ON

As a result, the input voltage Vip is sampled by the capacitor C11 and the input voltage Vim is sampled by the capacitor C12 while the charge corresponding to the offset voltage Vos is accumulated in the capacitors C51 and C52.

In addition, the capacitors C13 to C16 are short-circuited between the terminals, so that all the accumulated charges are discharged during time from the reset period until the sampling period. Furthermore, the capacitors C17 and C18 are charged by the reference voltage Vcm during time from the reset period until the sampling period.

<Charge Transfer>

Figure 25:
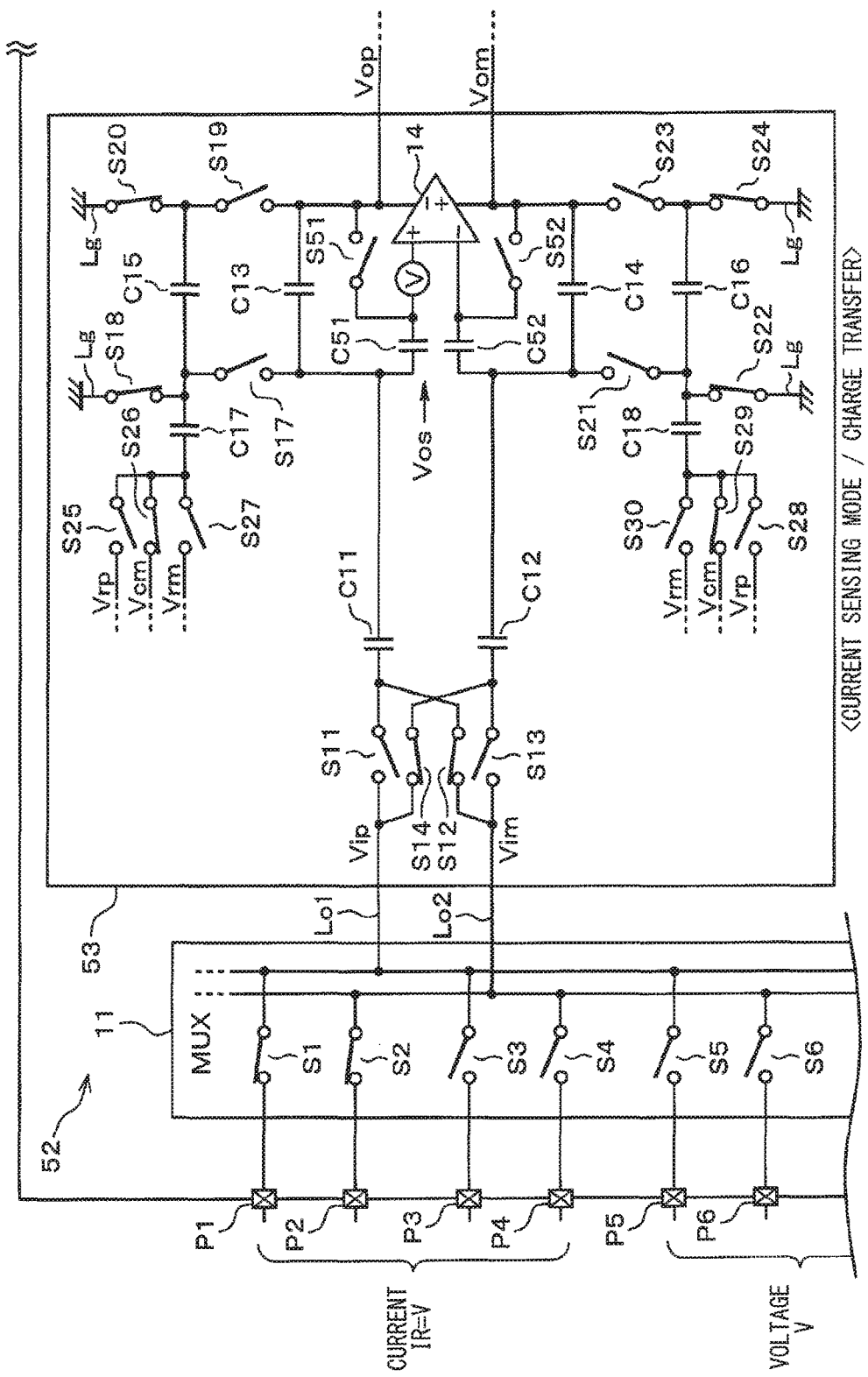
FIG. 25 is a diagram illustrating the operation for sensing the current flowing in the battery in the fifth embodiment, and schematically showing the circuit configuration of the voltage sensing device in the charge transfer period.

As shown in FIG. 25, the on/off states of the switches S11 to S14, S17 to S30, S51 and S52 during the charge transfer period are as follows.

S11: OFF, S12: ON, S13: OFF, S14: ON
S17: OFF, S18: ON, S19: OFF, S20: ON
S21: OFF, S22: ON, S23: OFF, S24: ON
S25: OFF, S26: ON, S27: OFF, S28: OFF, S29: ON, S30: OFF
S51: OFF, S52: OFF.

As a result, the charges accumulated in the capacitors C11 and C51 are transferred via the capacitor C13. In addition, the charges accumulated in the capacitors Q2 and C52 are transferred via the capacitor C14. The voltage Vo[1b], which is the difference voltage between the output voltages Vop and Vom output from the voltage sensing device 52 due to such charge transfer is expressed by the following equation (25).

$$Vo[1b]=(2\cdot Cs\cdot Vi)/Cf \qquad (25)$$

In the present embodiment, since the offset voltage Vos is sampled by the capacitors C51 and C52, the offset voltages Vos are included in each of the output voltages Vop and Vom. Accordingly, as is apparent from the above equation (25), the offset voltage Vos is not included in the voltage Vo[1b] which is the difference voltage between these output voltages.

In consideration of the capacitance ratio of the capacitors C11 to C18 shown in the above equation (20), the following equation (26) can be derived from the equation (25).

$$Vo[1b] = 16 \cdot Vi \qquad (26)$$

The ADC 10 receives the output voltages Vop and Vom obtained by the charge transfer to perform A/D conversion, and outputs digital data corresponding to the voltage difference Vo[1b], which is the difference voltage between these output voltages, to the controller (not shown).

<Digital Processing>

The controller (not shown) obtains the sensing value of the voltage across terminals of the shunt resistor Rs1 on the basis of the digital data corresponding to the voltage Vo[1b]. As apparent from the equations (25) and (26), the sensing value obtained in this way does not include the offset voltage Vas of the OP amplifier 14.

As described above, according to the present embodiment, effects similar to those of the first embodiment can be obtained. In this case, offset cancellation of the OP amplifier 14 has been achieved only by adding two circuit elements (capacitors C51 and C52) to the configuration of the fourth embodiment. Therefore, offset cancellation can be carried out without causing a significant increase in the circuit scale according to the present embodiment. Furthermore, according to the present embodiment, since sampling is performed only once at every sensing of a voltage, the effect of speeding up the sampling is obtained compared with the first embodiment.

Sixth Embodiment

Hereinafter, a sixth embodiment will be described with reference to FIG. 26.

Figure 26:
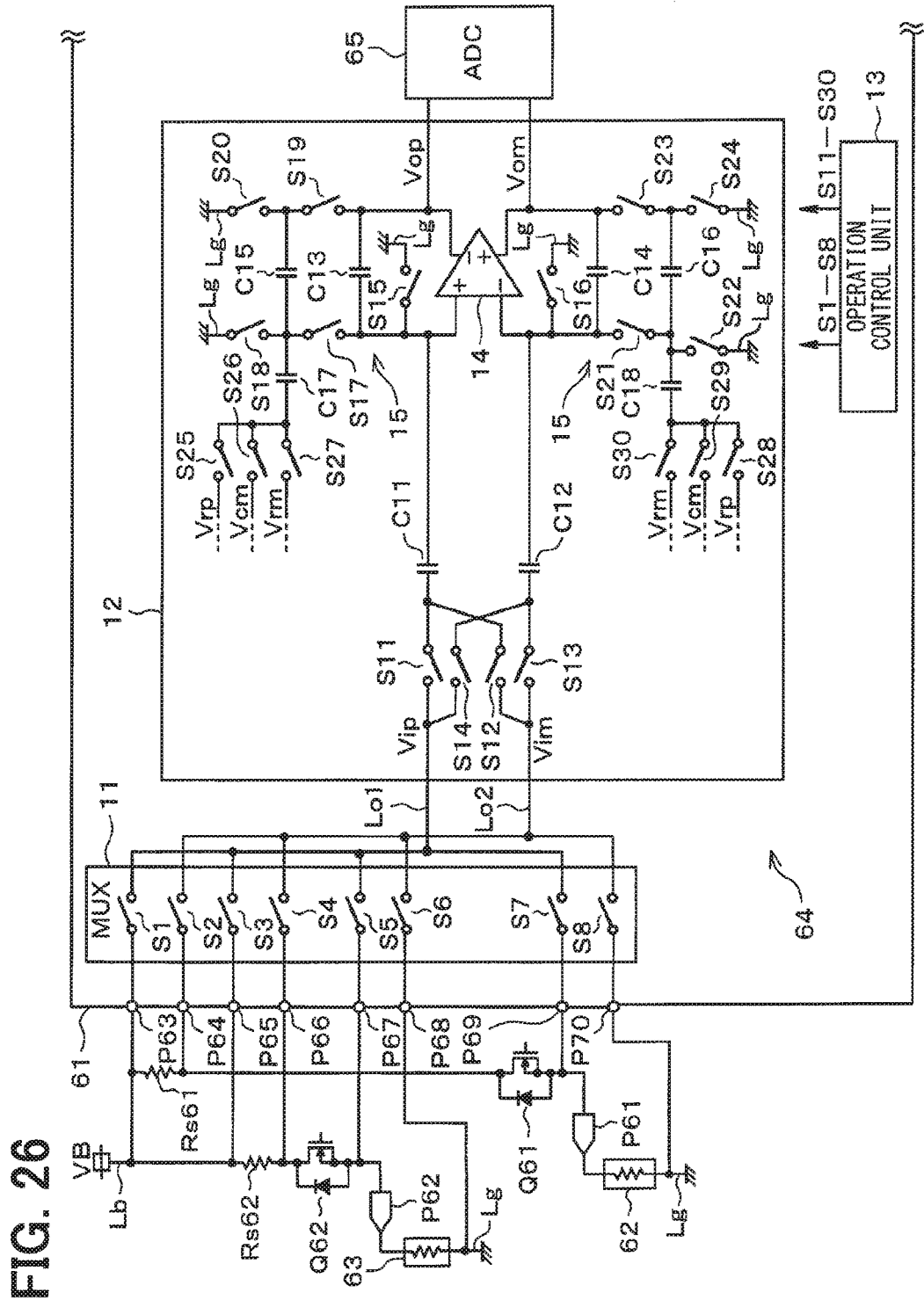
FIG. 26 is a diagram schematically showing a configuration of a sensing device according to a sixth embodiment.

A sensing device 61 shown in FIG. 26 senses the voltage and current of glow plugs 62 and 63 mounted on the vehicle, and is configured as an ACIC, for example. The glow plugs 62 and 63 are connected between terminals P61 and P62 and the ground line Lg, respectively.

The terminal P61 is connected to a power supply line Lb to which the power supply voltage VB is applied, via an N channel type MOS transistor Q61 (hereinafter abbreviated as a transistor Q61) for controlling energization to the glow plug 62 and via a shunt resistor Rs61. The power supply voltage VB is a battery voltage supplied from an in-vehicle battery, for example. The terminal P62 is connected to the power supply line Lb via an N channel type MOS transistor Q62 (hereinafter abbreviated as a transistor Q62) for controlling energization to the glow plug 63 and via a shunt resistor Rs62.

The sensing device 61 has a function of sensing a current flowing through the glow plugs 62 and 63, and a function of sensing a voltage across terminals of the glow plugs 62 and 63, and the like. The current flowing through the glow plug 62 is detected on the basis of the voltage across terminals of the shunt resistor Rs61 provided so as to be interposed in series in the path through which the current flows. The current flowing through the glow plug 63 is detected on the basis of the voltage across terminals of the shunt resistor Rs62 provided so as to be interposed in series in the path through which the current flows.

The terminals of the shunt resistor Rs61 are connected to terminals P63 and P64 of the sensing device 61, respectively. The terminals of the shunt resistor Rs62 are connected to terminals P65 and P66 of the sensing device 61. The terminal P62 and a ground line Lg are connected to terminals P67 and P68 of the sensing device 61, respectively. The terminal P61 and a ground line Lg are connected to terminals P69 and P70 of the sensing device 61, respectively. Note that the terminals P67 and P68 and the terminals P69 and P70 both correspond to two voltage sensing target nodes.

The sensing device 61 includes a voltage sensing device 64, an A/D converter 65, and the like. The voltage sensing device 64 has the same configuration as that of the voltage sensing device 9 of the first embodiment and the like, and is switchable between the voltage sensing mode and the current sensing mode. In this case, the voltage sensing mode is a mode used for sensing the voltage between the terminals P67 and P68, namely the voltage across terminals of the glow plug 63, or sensing the voltage between the terminals P69 and P70, namely the voltage across terminals of the glow plug 62 for example.

The current sensing mode is a mode used for sensing the voltage between the terminals P63 and P64, namely the voltage across terminals of the shunt resistor Rs61 for sensing the current flowing through the glow plug 62, or sensing the voltage between the terminals P65 and P66, namely the voltage across terminals of the shunt resistor Rs62 for sensing the current flowing through the glow plug 63.

The voltage sensing device 64 includes the same configuration as that of the voltage sensing device 9 and the like, namely the MUX 11, the SC amplifier circuit 12, and the operation control unit 13. In this case, terminals on one side of the switches S1 to S8 of the MUX 11 are connected to the terminals P62 to P70, respectively. Further, in the present embodiment, setting of the amplification factor of the SC amplifier circuit 12 is different from that of the first embodiment and others.

That is, in this case, it is assumed that the voltage across terminals of the glow plugs 62 and 63 is a voltage value in the range of +12 V to +14 V. Hence, in the present embodiment, the amplification factor in the voltage sensing mode, namely the first amplification factor is set to "0.25" for example, by setting (adjusting) the capacitance ratio. Thus, the voltage input to the ADC 10 can be made to fall within the input voltage range in the voltage sensing mode.

As described above, the sensing device 61 of the present embodiment includes the voltage sensing device 64 configured similarly to the voltage sensing device 9 of the first embodiment, and senses the voltage and current of the glow plugs 62 and 63 using the voltage sensing device 64. Therefore, according to the present embodiment as well, it is possible to obtain the same effect as the first embodiment, in particular, an excellent effect that highly accurate sensing can be achieved in accordance with the dynamic range of the input while suppressing an increase in the circuit scale.

OTHER EMBODIMENTS

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

In the second embodiment, though the voltage to be detected is made zero by causing the input to the capacitors C11 and C12 to keep the input voltage Vim during the second sampling and the second charge transfer, the voltage to be detected may be made zero by causing the inputs to the capacitors C11 and C12 to keep the input voltage Vip.

In each of the embodiments described above, though the sampling is executed twice or once at every sensing of a voltage, namely every acquisition of a signal (detected value), an oversampling method of sampling the input signal at a frequency sufficiently higher than the targeted sampling frequency can also be applied for each sampling. In this way, the sensing accuracy of the voltage or the current can be further improved. For example, in an embodiment in which sampling is performed twice for each sensing of a voltage, the sensing value may be obtained from the output of the ADC 10 after n-times repeated integration of "first sampling→first charge transfer" and the output of the ADC 10 after n-times repeated integration of "second sampling→second charge transfer". Here, n is a positive integer. In the case of applying the oversampling method, the entire sampling repeated n times can be counted as one sampling operation. Thus, the number of times of sampling performed at every sensing of a voltage includes not only purely twice or once, but also twice or once even in the case where the entire sampling repeated n times is counted as one sampling.

The switched capacitor amplifier circuit is not limited to the configuration shown in each of the above embodiments, as long as the circuit has a differential configuration including sampling capacitors and feedback capacitors, and configured to switch the amplification factors, and the specific configuration thereof can be appropriately changed. For example, the switched capacitor amplifier circuit may be provided with at least one of the feedback capacitor switching unit 15 for switching the capacitance value of the feedback capacitor and the sampling capacitor switching unit 35 for switching the capacitance value of the sampling capacitor, and may have configuration to switch the amplification factor by switching the switching unit. Further, the number of capacitors constituting the sampling capacitors may be appropriately changed according to the required capacitance value or the like.

In each of the above embodiments, examples of application of the voltage sensing device according to the present disclosure for sensing the voltage and current of the battery, and sensing the voltage and current of the glow plug have been described, but the voltage sensing device of the present disclosure can be applied to the entire application for sensing the voltage between the two voltage sensing target nodes and the voltage across terminals of the shunt resistor for sensing the current.

What is claimed is:

1. A voltage sensing device configured to switch between a voltage sensing mode for sensing a voltage across two voltage detection target nodes and a current sensing mode for sensing a voltage across terminals of a shunt resistor for sensing a current, the voltage sensing device comprising:
   a multiplexer that is configured to
      selects either two corresponding voltages at the two voltage sensing target nodes or two corresponding voltages at the terminals of the shunt resistor, and
      output either the two corresponding voltages at the two voltage sensing target nodes or the two corresponding voltages at the terminals of the shunt resistor, which are selected by the multiplexer, as a first output voltage and a second output voltage;
   a differential switched capacitor amplifier circuit that includes a sampling capacitor and a feedback capacitor, and that is configured to
      sample the first output voltage and the second output voltage through the sampling capacitor, and
      output sensing voltages corresponding to the first output voltage and the second output voltage by transferring a charge, which is stored in the sampling capacitor, through the feedback capacitor; and
   an operation control unit that is configured to control the multiplexer and the differential switched capacitor amplifier circuit,
   wherein the differential switched capacitor amplifier circuit is configured to change a gain of the differential switched capacitor amplifier circuit,
   wherein the operation control unit is configured to switch an operation mode to the voltage sensing mode by
      controlling the multiplexer to output each of the two corresponding voltages at the two voltage sensing target nodes, and
      controlling the differential switched capacitor amplifier circuit to change the gain to a first gain, and
   wherein the operation control unit switches the operation mode to the current sensing mode by
      controlling the multiplexer to output each of the two corresponding voltages at the terminals of the shunt resistor, and
      controlling the differential switched capacitor amplifier circuit to change the gain to a second gain, which is larger than the first gain.

2. The voltage sensing device according to claim 1, wherein the differential switched capacitor amplifier circuit further includes a feedback capacitor switching unit configured to
   change a capacitance of the feedback capacitor, and
   change the gain by changing the capacitance through the feedback capacitor switching unit.

3. The voltage sensing device according to claim 1, wherein the differential switched capacitor amplifier circuit further includes a sampling capacitor switching unit configured to
   change a capacitance of the sampling capacitor, and
   change the gain by changing the capacitance through the sampling capacitor switching unit.

4. The voltage sensing device according to claim 1, wherein the operation control unit controls the differential switched capacitor amplifier circuit to execute two sampling operations at every voltage sensing.

5. The voltage sensing device according to claim 4, wherein, when oversampling is applied to the every voltage sensing, the operation control unit
   counts sampling processes repeated a plural number of times as one sampling operation, the plural number of times being determined based on the oversampling, and
   controls the differential switched capacitor amplifier circuit to execute the two sampling operations at the every voltage sensing.

6. The voltage sensing device according to claim 5, wherein the differential switched capacitor amplifier circuit further includes a first sampling capacitor and a second sampling capacitor, which are configured as a pair, as the sampling capacitor, and
   wherein the operation control unit controls the multiplexer and the differential switched capacitor amplifier circuit to
      sample the first output voltage through the first sampling capacitor in one of the two sampling operations,
      sample the second output voltage through the second sampling capacitor in the one of the two sampling operations, sample the first output voltage by using the second sampling capacitor in another one of the two sampling operations, and sample the second output voltage by using the first sampling capacitor in the other one of the two sampling operations.

7. The voltage sensing device according to claim 5, wherein the differential switched capacitor amplifier circuit includes a first sampling capacitor and a second sampling capacitor, which are configured as a pair, as the sampling capacitor; and wherein the operation control unit controls the multiplexer and the differential switched capacitor amplifier circuit to sample one of the first output voltage and the second output voltage through the first sampling capacitor in one of the two sampling operations, sample another one of the first output voltage and the second output voltage by using the second sampling capacitor in the one of the two sampling operations, sample the one of the first output voltage and the second output voltage through the first sampling capacitor in another one of the two sampling operations, and sample the one of the first output voltage and the second output voltage by using the second sampling capacitor in the other one of the two sampling operations.

8. The voltage sensing device according to claim 1, further comprising:

an A/D converter, which has differential input terminals, that is configured to receive the sensing voltages output from the differential switched capacitor amplifier circuit, wherein the differential switched capacitor amplifier circuit is configured to provide an offset so that the sensing voltages fall within an input voltage range of the A/D converter, and wherein, when switching the operation mode to the voltage sensing mode, the operation control unit controls the differential switched capacitor amplifier circuit to provide the offset.

9. The voltage sensing device according to claim 1, wherein the two voltage sensing target nodes are connected to corresponding terminals of each battery cell as one part of an assembled battery, and wherein the shunt resistor is connected in series with a path of current flowing through the battery cell.

10. The voltage sensing device according to claim 9, wherein the sampling capacitor has an inter-wiring capacitance.

* * * * *